(12) United States Patent
Miller et al.

(10) Patent No.: US 6,852,202 B2
(45) Date of Patent: Feb. 8, 2005

(54) SMALL EPICYCLIC MAGNETRON WITH CONTROLLED RADIAL SPUTTERING PROFILE

(75) Inventors: Michael Andrew Miller, Sunnyvale, CA (US); James H. Tsung, San Jose, CA (US); Daniel C. Lubben, Santa Clara, CA (US); Ilyoung Richard Hong, San Jose, CA (US); Peijun Ding, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 21 days.

(21) Appl. No.: 10/418,710

(22) Filed: Apr. 17, 2003

(65) Prior Publication Data

US 2003/0217914 A1 Nov. 27, 2003

Related U.S. Application Data

(63) Continuation-in-part of application No. 10/152,494, filed on May 21, 2002.
(60) Provisional application No. 60/441,866, filed on Jan. 22, 2003.

(51) Int. Cl.[7] .................................................. C23C 14/35
(52) U.S. Cl. .......................... 204/192.13; 204/192.12; 204/298.03; 204/298.2; 204/298.16
(58) Field of Search ........................ 204/192.12, 192.13, 204/298.03, 298.19, 298.2, 298.16

(56) References Cited

U.S. PATENT DOCUMENTS

| | | | |
|---|---|---|---|
| 4,426,264 A | 1/1984 | Münz et al. ............. 204/192 R |
| 4,444,643 A | 4/1984 | Garrett ..................... 204/298.2 |
| 4,714,536 A | 12/1987 | Freeman et al. ......... 204/298.2 |
| 4,853,102 A * | 8/1989 | Tateishi et al. ........ 204/298.16 |
| 5,126,029 A | 6/1992 | Tomer et al. .......... 204/192.12 |
| 5,188,717 A | 2/1993 | Broadbent et al. ..... 204/192.12 |
| 5,944,968 A | 8/1999 | Kobayashi et al. ...... 204/298.2 |
| 6,183,614 B1 | 2/2001 | Fu ........................... 204/298.2 |
| 6,416,639 B1 | 7/2002 | De Bosscher et al. ... 204/298.2 |

FOREIGN PATENT DOCUMENTS

| | | |
|---|---|---|
| JP | 5-1373 | 1/1993 |
| WO | W/O 90/13137 | 11/1990 |

OTHER PUBLICATIONS

J. Musil et al., "Unbalanced magnetrons and new sputtering systems with enhanced plasma ionization", *J. Vac. Sci. Technol. A*, vol. 9, No. 3, May/Jun. 1991, 1171–1177 pp.
PCT/US 03/15620, International Search Report, 7 pp.

* cited by examiner

*Primary Examiner*—Rodney G. McDonald
(74) *Attorney, Agent, or Firm*—Charles S. Guenzer

(57) ABSTRACT

A small unbalanced magnet assembly is scanned in a retrograde planetary or epicyclic path about the back of a target being plasma sputtered including an orbital rotation about the center axis of the target and a planetary rotation about another axis rotating about the target center axis. The magnet assembly may pass through the target center, thus allowing full target coverage. A geared planetary mechanism may include a rotating drive plate, a fixed center gear, and an idler and a follower gear rotatably supported in the drive plate supporting a cantilevered magnet assembly on the side of the drive plate facing the target. The erosion profile may be controlled by varying the rotation rate through the rotation cycle or by modulating the target power. A second planetary stage may be added or non-circular gears be used. Auxiliary electromagnetic coils may create a focusing magnetic field.

36 Claims, 19 Drawing Sheets

SMALL EPICYCLIC MAGNETRON WITH CONTROLLED RADIAL SPUTTERING PROFILE

RELATED APPLICATION

This application claims benefit from provisional Ser. No. 60/441,866, filed Jan. 22, 2003, and is a continuation in part of Ser. No. 10/152,494, filed May 21, 2002, both incorporated herein by reference in their entireties.

FIELD OF THE INVENTION

The invention relates generally to sputtering of materials. In particular, the invention relates to the scanning motion of the magnetron creating a magnetic field to enhance plasma sputtering.

BACKGROUND ART

Sputtering, alternatively called physical vapor deposition (PVD), is commonly used in the fabrication of semiconductor integrated circuits for depositing layers of metals and related materials particularly for the formation of electrical interconnections. Somewhat older integrated circuit technology uses aluminum for horizontal interconnects and for vertical interconnects between metallization levels through vias having relatively modest aspect ratios. Such applications require fast deposition rates and high uniformity that are easily achievable with sputtering. The fast deposition rate has been achieved in part by magnetron plasma sputtering in which a working gas, for example, of argon is excited into a plasma. The positively charged argon ions are attracted to a negatively biased metallic target and strike it with sufficient energy to dislodge (sputter) metal atoms from the target, which then coat a wafer (circular substrate) positioned in opposition to the target. The sputtering rate is enhanced by positioning a magnet assembly in back of the target which creates a magnetic field parallel to the front face of the target. The magnetic field traps electrons and thereby increases the plasma density and hence the sputtering rate. The most prevalent type of magnetron in commercial fabrication uses a series of horseshoe or similar magnets having closely spaced poles. The magnets are arranged in a closed kidney-shaped path. Although such a magnetron has a fairly large total area, that is, the area encompassed by the outer periphery of the outer pole, the magnetic field extends over only a relatively small area between the two poles. To achieve the required uniformity of deposition, the kidney-shaped magnetron is rotated about the center of the target.

More advanced integrated circuit technology has placed somewhat different and more difficult requirements upon sputtering, and emphasis in sputtering has shifted from depositing horizontal interconnects to depositing vertical vias. The high complexity of advanced integrated circuits has been achieved in large part by decreasing the minimum feature size and the spacing between features. The complex wiring resulting from the large number of devices has been accomplished by interconnecting multiple wiring levels by vias extending through an intervening dielectric layer, often called an inter-level dielectric. As schematically illustrated in FIG. 1, a lower dielectric layer 10, typically formed of silicon dioxide or a related silicate glass, includes a conductive feature 12 at its surface. An upper dielectric layer 14 is deposited over it. A via hole 16 is etched through the upper dielectric layer 14 overlying the conductive feature. The width of the via hole 16 is being pushed to 0.13 μm and below. Minimum feature sizes of 0.10 μm and even 0.07 μm are being developed. However, the thickness of the inter-layer dielectric layer 14 may be constrained to be a minimum of about 0.7 to 1.0 μm to minimize cross talk and prevent dielectric discharge. As a result, the via holes 16 may have aspect ratios of 5:1 and greater. Sputtering is fundamentally a generally isotropic ballistic process ill suited to reaching into high aspect-ratio holes. If conventional sputtering is used to fill the hole 16 with metal, the sputtering is likely to preferentially coat the upper corners of the hole 16 and to close it before the bottom is filled.

Furthermore, with such small feature sizes, diffusion between the metal and dielectric portions must be minimized. Accordingly, a standard practice has developed to precoat the via hole 16 as well as the planar top of the upper dielectric layer 14 with a thin barrier layer 20 that prevents significant atomic diffusion through it. A typical barrier for aluminum metallization is a Ti/TiN bilayer and that for copper metallization is Ta/TaN although other barrier materials and combinations have been proposed. To achieve its purpose, the barrier layer 20 should significantly and fairly uniformly coat the sides of the via hole 16 and usually also coats the bottom. Again, sputtering is not inherently adapted for sidewall coverage.

Much work has been recently expended in developing the technology for copper metallization. Copper offers advantages of lower conductivity and reduced electromigration. Further, copper can be easily deposited even into high aspect-ratio holes by electrochemical plating (ECP). However, electrochemically plated copper requires that a copper seed layer 30, as illustrated in FIG. 2, be coated onto the top of the dielectric 14 and the sidewalls and bottom of the via hole 16 before a thick copper layer 32 is deposited by ECP. The copper seed layer 30 requires good bottom and sidewall coverage. Copper sputtering is preferred even under these difficult conditions for its economy and good film quality.

The thick ECP copper layer 32 acts both as the vertical electrical interconnects or vias and as the horizontal interconnects, typically in a process called dual damascene in which a trench is formed in the upper part of the dielectric layer 14 interconnecting multiple vias in the bottom part of the dielectric layer 14. The portion of the thick ECP copper layer 32 extending above the trench and the top of the dielectric layer 14 is removed by chemical mechanical polishing (CMP). As shown for both copper seed and barrier applications, sputtering is being used less for depositing thick conductive layers and more for depositing thin layers in unfavorable geometries, in what are called liner applications.

Both the barrier layer 20 and copper seed layer 30, when deposited by conventional sputtering, tend to suffer the same type of non-uniform deposition typified by a sputtered layer 36 illustrated in the cross-sectional view of FIG. 3. A blanket portion 38 on the top of the dielectric layer 14 is relatively thick compared to a sidewall portion 40 and a bottom portion 42. The sidewall portion in high-aspect ratio holes 16 typically exhibits the lowest coverage relative to the blanket portion 38 and further often suffers from a minimum thickness 44, which needs to be maintained above a critical level to provide an electroplating current path to the bottom of the hole 16. Furthermore, an overhang portion 46 tends to form at the top of the hole 16 with a reduced entrance aperture 48. Although electroplating is generally effective at filling copper into a high aspect-ratio hole 16, it tends to be nearly conformal so that the entrance aperture 48 may close prior to completing the filling of the bottom of the hole 16. The resulting void in the copper severely affects the performance and reliability of the resulting device. An overly thin sidewall area 44 also results in a void included in the copper. Furthermore, sidewall asymmetry needs to be minimized, as will be discussed later.

It has been recognized that effective sputtering of the barrier and copper seed layers can be accomplished by assuring a high fraction of ionized sputter metal atoms, whether of the barrier metal or of the copper, and by RF biasing the pedestal electrode supporting the wafer. The RF bias creates a negative DC bias on the wafer, accelerates the metal ions toward the wafer. The high forward velocity promotes the penetration of the metal ions deep into the high aspect-ratio holes. Furthermore, the high-energy ions tend to etch some material from the exposed overhangs 46

A high density plasma of the sputter working gas increases the metal ionization fraction. Some suggestions have been made to achieve the high density plasma by inductively coupling additional RF power into the chamber. However, inductively coupled reactors tend to require high argon pressures, which result in a high-temperature operation with possible damage from the energetic argon ions being accelerated to the wafer. The metal ionization fraction can also be increased by increasing the DC target power. However, for the 300 mm wafer technology being developed and even for 200 mm wafers, this approach causes the required power supplies to become prohibitively expensive, and controlling the target temperature becomes difficult.

Another and preferred approach, sometimes called self-ionized plasma (SIP) sputtering, described by Fu in U.S. Pat. No. 6,183,614, incorporated herein by reference in its entirety, is particularly useful for barrier or seed sputtering in which only very thin layers are deposited, for example, a field thickness of 150 nm or less, which results in a much thinner sidewall thickness within the hole. SIP sputtering may be implemented with conventional planar targets in generally conventional and inexpensive magnetron sputter reactor chambers. In contrast, inductively coupled reactors require inductive coils in an expensive new design, and hollow cathode or vaulted target reactors expensive complexly shaped targets. SIP sputtering is based upon a small but strong magnetron which concentrates the high-density plasma region over a relatively small area of the target. As a result, somewhat modest power supplies of about 20 to 40 kW can be used to create a very high effective power density in the portion of the target underlying the magnetron. The high density plasma creates a high ionization fraction of the metal ions, estimated to be about 20% or greater. The metal ions are attracted to the wafer by RF biasing of the pedestal electrode to promote the coating the sides of deep holes.

Nonetheless, high target power continues to present a problem. High-capacity power supplies are expensive and not only consume large amounts of expensive electrical power but require further power to chill the target and to air condition the clean room.

In SIP sputtering, the metal ion density may be raised high enough that a significant fraction of the metal ions are attracted back to the biased target to resputter the target, hence the term self-ionized plasma. As a result, once the plasma has been ignited, the argon pressure in the chamber can be reduced to 5 milliTorr or less, often less than 0.5 milliTorr. The reduction in pressure reduces the probability of scattering of the metal ions on their way to the wafer as well as reduces argon heating of the wafer. A collision of a metal ion and argon would likely neutralize the metal atom. In the case of copper sputtering, under the right circumstances, the argon can be removed completely in a process called self-sustained sputtering (SSS).

SIP sputtering also benefits from an unbalanced magnetron that includes an inner pole of one vertical magnetic polarity surrounded by an outer pole of the opposed polarity. The total magnetic strength or intensity of the outer pole, that is, the magnetic flux integrated over the area of the outer pole, is substantially greater than that of the inner pole, for example, by at least a factor of 1.5 and preferably 2 or more. The closed shape of the magnetron lessens electron loss in the high density plasma adjacent the target. The unbalanced magnetic field results in magnetic field lines projecting far from the stronger outer pole towards wafer. The projecting field lines both support a more extensive plasma and guide the metal ions towards the wafer.

Reasonable levels of sputtering uniformity and full target erosion are achieved in SIP sputtering by rotating the small magnetron about the center of the target and by shaping the magnetron to favor the outer portions of the target. In one embodiment, the outer pole of the unbalanced magnetron has a generally triangular shape with a triangular inner aperture in which is disposed the inner pole. Apex angles for the most acute corner are typically around 20 to 35°, and the acute apex of the triangular pole overlies or is close to the center of rotation. The base of the triangular pole is close to the outer periphery and may be curved to follow the target circumference.

Although the rotating triangular magnetron provides reasonably adequate uniformity for planar or blanket deposition, uniformity for thin liner layers in high-aspect ratio holes is a complex requirement, as has been partially discussed with reference to FIG. 3. Sidewall coverage needs to be relatively high, and it needs to be uniform across the large wafer. Furthermore, the sidewall coverage on one sidewall should not differ significantly from sidewall coverage on the opposed sidewall. That is, the sidewall coverage should be symmetric at all points on the wafer. For neutral sputter particles, the deposition uniformity and sidewall symmetry are difficult to achieve near the edge of the wafer, since the edge is predominantly exposed to the generally isotropic neutral flux principally arising from the inner side of the target. The projecting magnetic field from the unbalanced triangular magnetron is very non-uniform in the radial direction, and its non-uniformity cannot be compensated by only circumferential scanning. The triangular design by itself is constrained by the relatively few independent design parameters in optimizing the many factors of uniformity and deep hole coating. Various types of auxiliary magnets have been proposed to compensate the inherent non-uniform magnetic field in a triangular magnetron, but these designs suffer their own deficiencies. Even a circular magnetron produces a magnetic field varying across its radial directions.

Circumferentially scanned magnetrons manifest another problem with non-uniform erosion in the radial direction. This problem arises even when the magnetron has a rather large size, such as the conventional kidney-shaped magnetron. A typical erosion pattern 52 below an initial planar target surface 54 for a triangular SIP magnetron is illustrated in FIG. 4 for a magnetron having a target layer of the sputtering material, such as tantalum, bonded along an interface 56 to a backing plate of a different material that is less expensive and more easily machined. Distinctive annular trough-shaped erosion paths develop. It is difficult to achieve high utilization of the target center with only circumferential scanning of the small magnetron favored for SIP sputtering. Although the non-uniform erosion is reduced with the use of large kidney-shaped magnetron, it still occurs to a significant degree. The lifetime of the target is determined by the first exposure of the backing plate. Further sputtering would contaminate the wafer with the non-desired material of the backing plate, and the target must be discarded or at least refurbished with a new target layer. Non-uniform erosion produces poor overall target utilization, about 38% in the illustrated example. When an integral target is used without a distinct backing plate, as is typical for aluminum or copper sputtering, the considerations are somewhat different, but poor target utilization resulting from erosion tracks is still a problem. It is greatly desired to achieve more uniform sputtering to avoid excessive expense and downtime in replacing targets.

For SIP sputtering, the design of the magnetron directly influences three principal issues: (1) uniform thickness of a thin layer across the wafer and in particular symmetric sidewall coverage; (2) uniform target erosion; and (3) ionization fraction of sputtered atoms. It is difficult to optimize a magnetron design for all three factors. It would be desirable to decouple the optimization of some of these issues.

Magnetron sputtering being used for a variety of applications with differing requirements on the shape and intensity of the magnetic field. This variety produces commercial problems. While satisfactory sputtering reactors have been designed for most of these applications, often the reactors and their magnetrons have significantly different designs. The increasing number of different types of reactors and magnetrons imposes economic and inventory penalties in designing, distributing, and maintaining so many different types of reactors. It is thus desired to obtain a universal design for a sputter reactor and its magnetron in which small changes in the design or changed operational parameters allow the same design to be used in disparate applications.

Various suggestions have been made to scan a magnetron in both circumferential and radial directions about a circular target, typically in an epicyclic pattern of a primary rotation about the target center and a secondary rotation about the end of the arm of the primary rotation. See for example, U.S. Pat. No. 4,714,536 to Freeman et al. and U.S. Pat. No. 5,126,029 to Tomer et al. The Freeman design seems more practical, but it suffers from an inability to rotate the magnetron near to or over the target center, and it is prone to excessive vibration. The Tomer design allows for center scanning, but its stationary internally toothed circumferential gear is unwieldy. The Tomer design is directed to smoothing non-uniform erosion tracks produced by a larger magnetron.

SUMMARY OF THE INVENTION

A planetary magnetron may be used in a plasma sputter reactor for increased uniformity of sputter deposition, more complete target utilization, and increased plasma density. The magnetron may be optimized for high plasma density, for example, by a small circular design, while the planetary motion may be optimized for uniform film thickness and full target utilization.

A planetary mechanism causes the magnetron, preferably including a magnet assembly much smaller than the target, to execute planetary motion in which the magnet assembly both rotates about the center of the target in an orbital motion and further rotates in a planetary rotation about an axis also rotating about the target center. The mechanism preferably allows the magnet assembly to scan over the center of the target. The motion is preferably retrograde planetary motion in which the planetary rotation is opposite to the orbital rotation, but forward planetary motion provides many of the same results.

In one embodiment, rotation ratios of 1.03 to 6 as measured by gear ratios or other engagement ratios are preferred but integral values should be avoided. Rotation ratios from about 1.2 to about 1.66 and from about 2.5 to 4.97 provide a significantly larger velocity at the target center than at the target periphery. Preferably, the engagement ratio should not be too close to an integral value, which would produce a very small number of lobes and thus poor target utilization. The gear ratio is preferably based on the numbers of teeth in the fixed and follower gear which are incommensurate, that is, have no common denominator. For commonly available gears, this requirement is often satisfied by an odd number of teeth in one gear and an even number in the other or two different odd numbers for the two gears.

The planetary mechanism may include a geared mechanism including an inner gear arranged around the central axis of the target, a rotary drive shaft extending along the axis and rotating a drive plate, an idler gear supported on the drive plate and engaged with the inner gear, and a follower gear supported on the drive plate and engaged with the idler gear. A bottom plate positioned between the drive plate and the target is fixed to the shaft of the follower gear and rotates with it. A magnet assembly depends from one end of the bottom plate adjacent the back of the target and executes the retrograde planetary motion. Other features of the geared planetary mechanism may be applied to the belted planetary mechanism.

The inner gear may be fixed, in which case the gear ratio between the follower and fixed inner gear determines the rotation ratio between the follower gear and attached magnet assembly and the drive plate, that is, the ratio of planetary and orbital rotation rates. The ratio of the magnet assembly velocities at the target center and at the target periphery is determined by the gear ratio and additional by the ratio of rotation arms from the target center to the follower gear and from the follower gear to the magnet assembly.

Preferably, a first counterweight is supported on the end of drive plate opposite the follower gear, and a second counterweight is supported on the end of the bottom plate opposite the magnet assembly.

The inner gear may alternatively be rotated by a second rotary shaft.

The profile of target erosion can be controlled by modulating the rotation frequency of the planetary mechanism or by modulating the target power as a function of the rotation position, particularly of the radial position of the magnet assembly on the target. In one embodiment, the rotation rate is increased or the target power decreased when the magnetron is near the target center. A position sensor partially disposed on the magnet assembly may be used to synchronize the rotation or power modulation with the radial position of the magnet assembly.

The planetary mechanism may include two planetary stages with three arm lengths and two gear ratios selected for optimized sputtering patterns. The geared planetary mechanism may alternatively be implemented with a fixed external gear with inwardly projecting teeth engaging the follower gear rotated on the drive plate. No idler gear is required.

The planetary mechanism may instead include a belted mechanism including a capstan around the central axis, a rotary drive shaft extending along the axis and rotating a drive plate, a follower pulley support on the drive plate, and a belt wrapped around the capstan and follower pulley. The bottom plate and attached magnetron located beneath the drive plate are fixed to the shaft of the follower pulley and rotates with it. The capstan may be either fixed or rotated by a separate drive shaft.

The small magnet assembly, preferably having no more than 10% of the area of the target being scanned, may be an unbalanced magnetron having a weak inner pole of one polarity along the central target axis surrounded by a stronger outer pole of the opposed polarity. The ratio of integrated magnetic fluxes of the two poles is preferably at least 1.5 and preferably at least 2. For deep hole filling, the magnetic flux ratio is advantageously further increased to 3 or 5 or even more. Extra magnetic flux may be provided by multiple rows of close packed cylindrical magnets or by a magnetic annulus, perhaps formed of multiple arc-shaped segments. The small magnet assembly may alternatively be a balanced magnetron having equal-intensity inner and outer opposed band-shaped poles separated by a gap. In either case, the magnet assembly may be circularly symmetric or may have another shape.

For unbalanced magnetron, auxiliary coaxial electromagnets may be used, preferably powered to produce magnetic fields in their bores that are parallel (not anti-parallel) to the magnetic field produced by the stronger outer magnetron pole, thereby bringing the projecting magnetic field to the substrate. The coaxial electromagnets may be placed around the processing space between the target and the substrate or in back of the substrate. The bore of the back electromagnet may be smaller than the diameter of the substrate. If both electromagnets are used, the side one is preferably larger than the back one in a ratio of at least 1.5 or more preferably 2.

DETAILED DESCRIPTION OF THE PREFERRED EMBODIMENTS

One principal embodiment of the invention relies upon a planetary mechanism, for instance, one using a single-stage planetary gear system, to allow a small circularly symmetric magnetron to fully cover the sputtering target. The planetary mechanism produces a planetary motion similar to that of a point on the surface of a planet orbiting the sun while it is simultaneously executing planetary rotation about its own polar axis. Alternately, it may be view as the motion of a satellite orbiting a planet that is simultaneously orbiting the sun. In the magnetron of this embodiment, the satellite's orbital axis is parallel to but displaced from the planet's orbital axis and the orbit is circular about the orbital axis. The magnet assembly of the magnetron is displaced from and rotates about the planetary axis while the planetary axis orbits or rotates about the orbital axis, thereby producing a complex trajectory for the magnetron fixed at the end of the second planetary arm. In retrograde planetary motion, the direction of planetary rotation is the reverse to the direction of orbital rotation.

Figure 5:
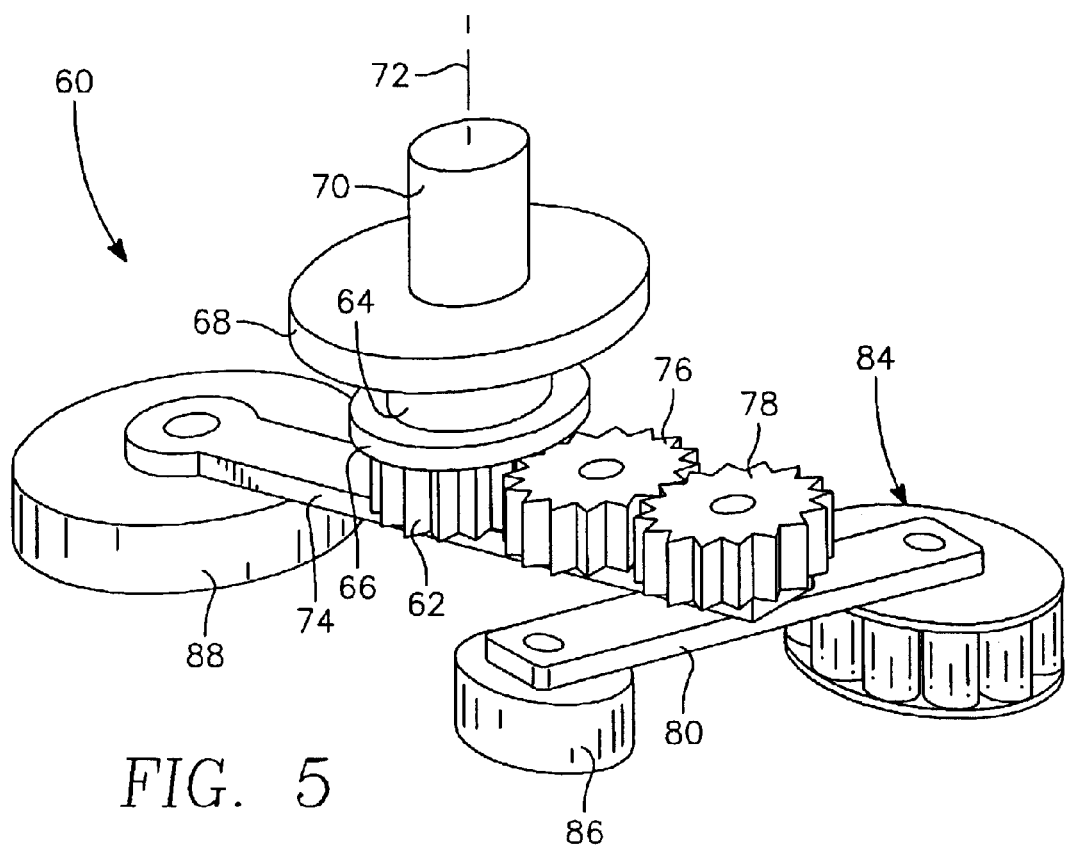
FIG. 5 is an orthographic view of a geared planetary magnetron.

In one geared embodiment illustrated in the orthographic view of FIG. 5, a magnetron assembly 60 includes a fixed gear 62 fixed to a stationary circular mount 64 attached to an unillustrated top wall of the magnetron housing through two mounting plates 66, 68. A motor drive shaft 70 is coaxial along a central chamber axis 72 with the fixed gear 62 and freely passes through the fixed gear 62 to support beneath it an attached main carrier or drive plate 74, which thereby rotates about the center 72 of the fixed gear 62 and acts as the planetary driver. A center or idler gear 76 is freely and rotatably supported on the drive plate 74, but its teeth are engaged with the teeth of the fixed gear 62. A rotating or follower gear 78 is similarly freely and rotatably supported on the drive plate 74, and its teeth are engaged with the teeth of the idler gear 76. As a result, as illustrated also in the top plan view of FIG. 6, as the motor driven shaft 70 rotates and drives the drive plate 74, the idler gear 76 and the follower gear 78 gear rotate with it about the central axis 72, for example in the counter-clockwise direction, and the idler gear 76 is rotating in the counter-clockwise direction about its own axis. Simultaneously, the follower gear 78 is rotating about its own axis in the opposed (clockwise) direction.

Figure 6:
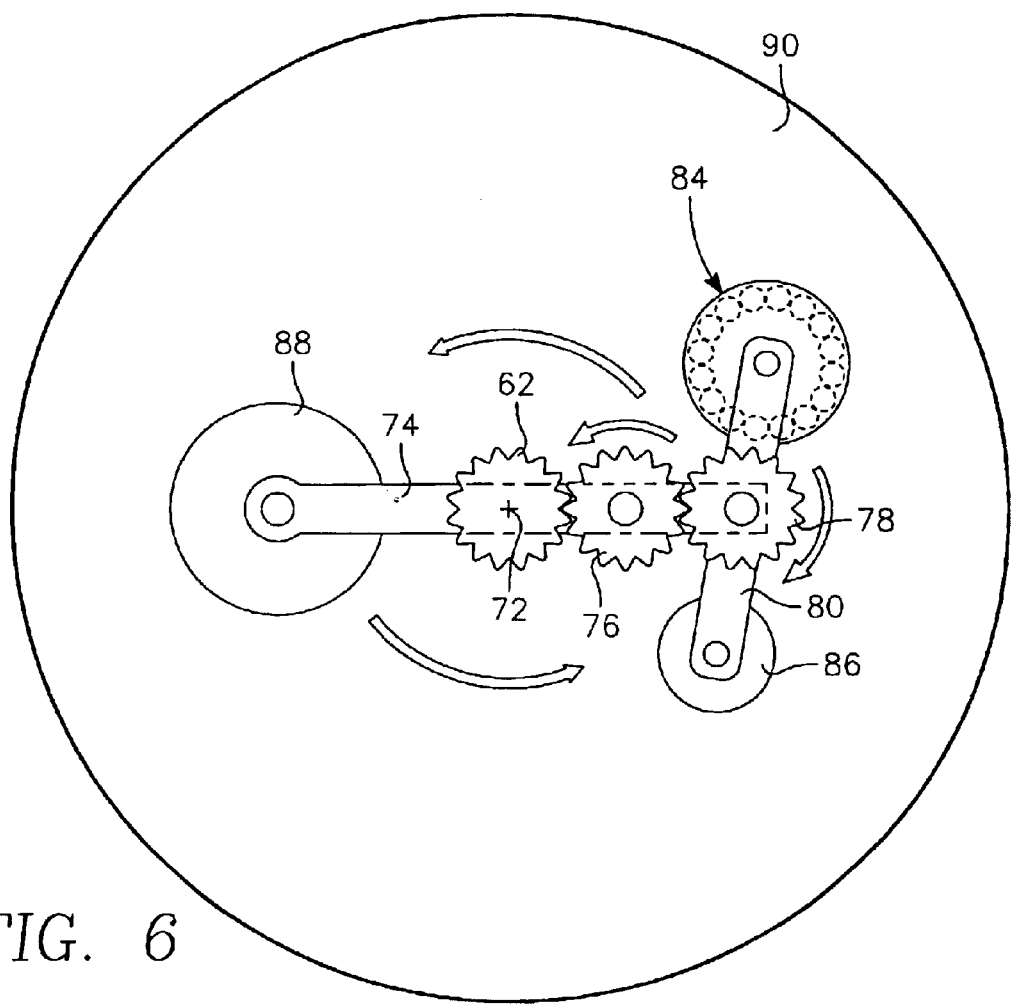
FIG. 6 is a top plan view of the planetary magnetron of FIG. 5.

The follower gear 78 is fixed to and supports a bottom plate 80 located beneath the drive plate 74 so that the bottom plate bottom plate 80 thus rotates with the follower gear 78. Because of the suspended and cantilevered design, the bottom plate 80 may rotate through the center axis 72. A magnet assembly 84 is supported beneath one end of the bottom plate 80, and a magnet counterweight 86 is supported beneath the other end of the bottom plate 80. Another counterweight 88 is attached to the other end of the drive plate 74. The drive plate 74 and the bottom plate 80 will be alternatively referred to as arms although the arm lengths are measured from the rotation center of the arm to the outer support points. The counterweights 86, 88 are best implemented as integral bodies of circularly symmetric shapes. This gear arrangement causes the magnet assembly 84 to execute an epicyclic or planetary motion with a primary arm of rotation of length $A_1$ extending along the drive plate 74 and a secondary arm of rotation of length $A_2$ extending through the bottom plate 80. With reference to FIG. 6, the planetary mechanism sweeps the relatively small magnet assembly 84 over substantially the entire usable surface of a much larger target 90, which is also circularly symmetric about the center axis 72.

The dual counterbalancing minimizes magnetron vibration in its complex motion despite the lack of mechanical support at the bottom of the rotating assembly. Preferably, the magnet assembly 84 and its counterbalance 86 have the same mass and have equal rotation arms about the center of the follower gear 78. Similarly, the primary counterbalance 88 preferably has the same mass and the same rotation arm about the center axis 72 as the total assembly it balances. The balanced masses and moments of inertia should be within 90% and preferably 95% of each other.

The planetary motion, as best illustrated in the top plan view of FIG. 6, includes the counter-clockwise rotation of the drive plate 74 about the central axis 72. The idler and follower gears 76, 78 carried by the drive plate 74 also rotate with it about the central axis 72 but additionally rotate about their own axes, the idler gear 76 additionally rotating counter-clockwise and the follower gear 80 additionally rotating clockwise. The magnet assembly 84 carried on the bottom plate 80 fixed to the follower gear 78 also rotates in a counter-clockwise orbital rotation about the central axis 72 and additionally performs a clockwise planetary rotation about the axis of the follower gear 78. The two opposed rotation directions of the magnet assembly is called a retrograde planetary motion. The rotation rate of the follower gear 78 is directly related to the rotation rate of the driven shaft 70 according to the gear ratio $R_G$ between the fixed and follower gears 62, 78. For the simple illustrated geared planetary system, the gear ratio G is equal to the ratio of the diameters of the follower and fixed gears 78, 72

$$G = \frac{D_{FIXED}}{D_{FOLLOWER}},$$

although the gear ratio is more fundamentally determined by the ratio of the number of gear teeth $$G = \frac{N_{FIXED}}{N_{FOLLOWER}},$$

which two equations are equivalent in the usual situations of the teeth of the two gears 72, 78 being equally spatially separated along the respective circumferences. These equations do not take into account the sign of the gear ratio G, that is, whether the gear arrangement produces forward or retrograde motion. One or more idler gears may be interposed between the fixed and follower gears 72, 78. If a respective idler gear engages its two neighboring gears with the same number of teeth, the gear ratio G is not affected. However, if the idler gear includes two coaxial gear parts of different diameters, this ratio will affect the overall gear ratio. It is well known how to calculate gear ratios for more complicated gear arrangements.

The planetary gear system may be varied to achieve different operational results. However, it has been found that superior results can be obtained in one case with a circularly symmetric magnetron when the two arms of the magnetron have approximately equal lengths, for example a ratio of between 0.66 and 4 where the planetary motion is retrograde, and where the gear ratio between the follower and fixed gears is non-integral. The nearly equal arm lengths, each equal to about half the target radius, allow the circular magnetron to sweep from the periphery of the target 90 to its center and over the center 72, thus allowing full target coverage. Gear ratios of greater than two produce a tight path 92 illustrated in FIG. 7 in which the diamonds mark equal time intervals and represent the center of the magnet assembly 84. This path 92 is calculated for a gear ratio of 1:3.15, a planetary arm that is 0.8 that of the primary arm, and a reverse rotation of the follower gear, that is, retrograde planetary motion.

The path 92 is assumed to be the center of a moderately sized magnet assembly 84 so that magnetic portions of the magnet assembly may near to or possibly over the target center 72. The complete counterbalancing of the magnetron assembly of FIGS. 5 and 6 allows the elimination of a center support post, which in the Freeman design prevents over scanning of the target center. Generally, the number of lobes, here about three for a single rotation of the drive plate, is approximately equal to the gear ratio for either forward or retrograde planetary motion. However, if the gear ratio is not an integral value, the pattern does not replicate over the relatively short periods illustrated. Instead, the lobes precess to more uniformly cover the target 90.

If the gear ratio is relatively close to unity, the path in retrograde motion is generally circular about an offset center but the circular pattern precesses for non-unity values. On the other hand, the corresponding path in forward motion is cardioid with the velocity approaching zero at the center.

Figure 7:
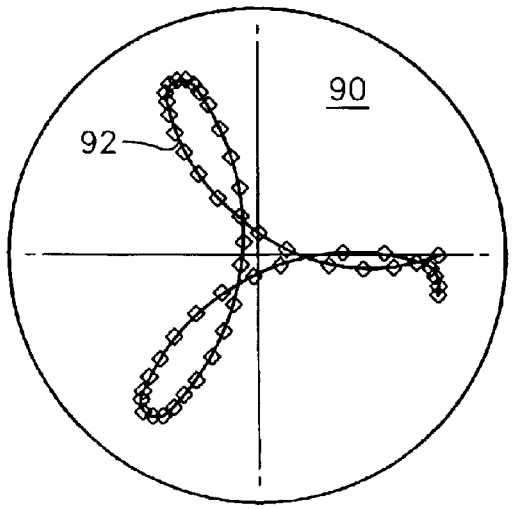
FIGS. 7 and 8 are plots of the paths of the magnet assembly under planetary motion.
Figure 8:
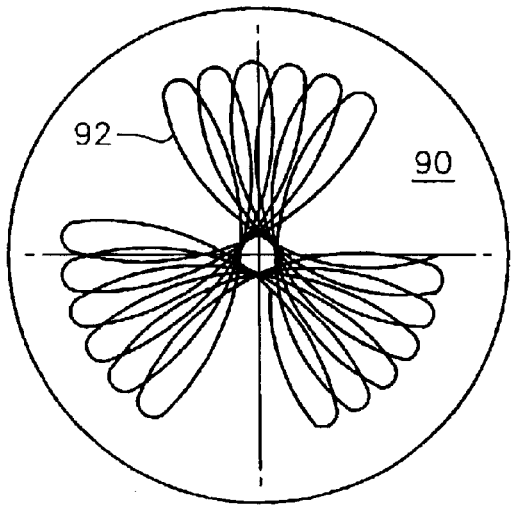

The path 92 is illustrated in FIG. 7 for a single rotation of the drive shaft, which for a shaft rotation of 60 rpm represents about 1 s. The path 90 illustrated in FIG. 8 extends over 6 s. It is seen that about a 10 s scan will provide full coverage of the target and represents a full coverage period. Although ideally the sputtering time should be a full coverage period, 10 s in the illustrated case, or an integral multiple thereof to avoid non-uniform overlap between successive complete scans, in fact, the sputtering pattern for retrograde planetary motion with a nearly integral gear ratio has a near multi-fold azimuthal symmetry so that for a reasonably large throw length, the azimuthal non-uniformity is typically not a significant problem. From equations developed below, it will become clear that advantageous velocity differences may be obtained in the range to 1 to 6, preferably 1.5 to 5, with integral values being disfavored because of a lack of precession. Forward planetary rotation will produce nearly the same erosion pattern with a differently shaped path and generally with a larger variation in velocity relative to fixed coordinates.

Film deposition uniformity will be improved by decreasing the time period over which the trajectory 92 repeats itself in an approximately and even erosion of the target. Erosion non-uniformity is improved by maximizing the number and the overlap of the lobes in the trajectory 92. This can be easily accomplished by assuring the numbers $N_1$ and $N_2$ of teeth in the fixed and follower gears 62, 78 are incommensurate, that is, contain no common factors. For example, a gear ratio of 25:22 is superior to a gear ratio of 24:22. One set of gear ratios implemented for test has a gear ratio of 35:22=1.59 resulting in a repetition period of 22 s. For many useful and practical gear ratios with the number of teeth between 16 and 80, this requirement results in an even and odd number of teeth or two different odd numbers.

Uniformity will also be improved for short and variable sputtering times if the lobes of the trajectory 92 are not too narrow and not too closely spaced. This condition is met if the gear ratio G is not only non-integral but also is not close to being an integer, for example, G differs from any integer by at least 0.1 and preferably by at least 0.2, for example, between 3.1 and 3.9 or between 3.2 and 3.8. However, exactly half integral values, third or two-thirds integral values, that is for example, $3\frac{1}{2}$, $3\frac{1}{3}$, and $3\frac{2}{3}$, and the like should also be avoided because of desirability of incommensurate gear ratios for a reasonably large number of gear teeth.

Figure 9:
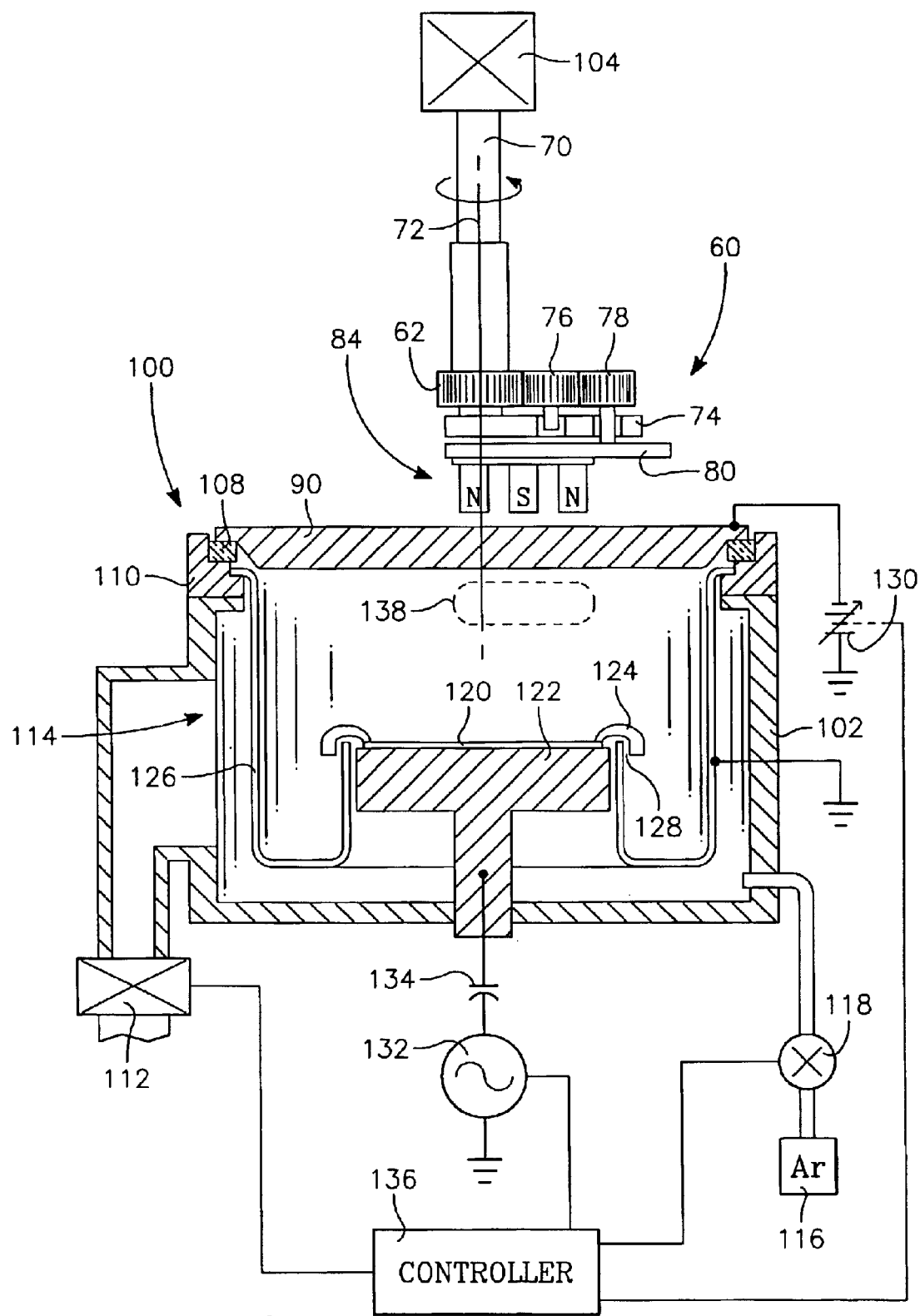
FIG. 9 is a sectioned side view of a sputter reactor incorporating the planetary magnetron of FIGS. 5 and 6.

The magnetron 60, schematically illustrated in FIG. 9 without the counterweights and fixed support structure, may be used in an otherwise fairly conventional plasma sputter reactor 100 having a chamber body 102 arranged around the central axis 72. In this embodiment, a motor 104 connected to the shaft 70 rotates the planetary magnetron 60 about the central axis 72 at a constant rotation rate, for example, 100 rpm.

The metallic target 90 is vacuum sealed through an annular isolator 108 to an adaptor 110, which is sealed to the chamber body 102 and allows easy adjustment of the spacing between the target and the wafer. A vacuum pump 112 pumps the interior of the chamber 102 through a pumping port 114. A gas source 116 supplies a sputter working gas, such as argon, into the chamber 102 through a mass flow controller 118. If reactive sputtering is desired, for example, of a metal nitride, a reactive gas, such as nitrogen in the example, is also supplied.

A wafer 120 is supported on a pedestal electrode 122 in opposition to the target 90. A wafer clamp ring 124 may be used to hold the wafer 120 to the pedestal 122 or to protect the pedestal periphery. Modern reactors use electrostatic chucks to wafer 120 to the pedestal 122. An electrically grounded shield 126 supported on the adapter 110 protects the chamber walls and sides of the pedestal from sputter deposition and also acts as an anode in the plasma discharge. The working gas enters the main processing area through a gap 128 between the clamp ring 124 and the shield 126. Other shield configurations may be including an electrically floating secondary shield inside the primary shield 126 and perforations through portions of the primary shield 126 protected by the secondary shield to promote gas flow into the processing area.

A DC power supply 130 negatively biases the target 90 with respect to the grounded shield 126 and causes the argon working gas to discharge into a plasma. The positively charged argon ions are attracted to the target 90 with sufficient energy to sputter the metal from the target 90, and the sputtered metal deposits on and coats the surface of the wafer 120. Preferably for deep hole filling, an RF power supply 132 is connected to the pedestal electrode 162 through a capacitive coupling circuit 134, which acts as a high-pass filter, to create a negative DC self bias on the wafer 120. The self bias is effective at accelerating positive metal ions toward the wafer 160 in perpendicular trajectories that more easily enter high-aspect holes. The self bias also imparts a high energy to the ions, which may be controlled to differentiate sputter deposition and sputter etching of the wafer 120. A controller 136 controls the vacuum pump 112, the argon mass flow controller 118, and the power supplies 130, 132 according to the desired sputtering conditions.

The magnetron 60 creates a magnetic field component parallel to the face of the target 90 underlying the transient position of the circular magnet assembly 84 and thereby creates a small region 138 of a high-density plasma producing a high sputtering rate in the adjacent portion of the target 90 and a high metal ionization fraction. The unbalanced magnet assembly 84 also creates magnetic field components which project from the target 90 towards the wafer 120 and guide the metal ions to the wafer 120. The circularly symmetric magnet assembly 84 creates a circularly symmetric magnetic field distribution for both the parallel and projecting components of the field.

The magnet assembly 84 performs a planetary motion about the central axis 72 coincident with the center of the target 90. With reference also to FIGS. 5 and 6, the drive shaft 70 extends along and rotates about the central axis 72 to rotationally drive the carrier or drive plate 74 in an orbiting motion about the central axis 72. The idler gear 76, which is engaged with the fixed gear 62 (whose support structure is not shown in FIG. 6), and the follower gear 78, which is engaged with the idler gear 76, are rotatably supported on the orbiting drive plate 74 to rotate about their respective axes. The bottom plate 80 supporting the magnet assembly 84 on one side is rotated by the follower gear 78 about the follower gear axis.

The magnet assembly 84 thus performs a planetary motion that may be designed by proper selection of the arm lengths and the magnet size to be able to sweep over or arbitrarily near the center 72 of the target 90 as well the target periphery. The full coverage is obtained by cantilevering the two plates 74, 80 from the drive shaft 70. The two counterweights 86, 88 of FIG. 5 allow this eccentric and cantilevered motion without undue vibration. However, it is usually desired that the magnetically strong portions of the magnet assembly 84 not pass through the center axis 72 since this typically produces excessive center erosion. Nonetheless, the mechanical portions of the magnet assembly 84 may need to pass through the target center 72, and even the typically desired grazing trajectory precludes significant mechanical support for the rotary magnetron on its side facing the target.

Figure 10:
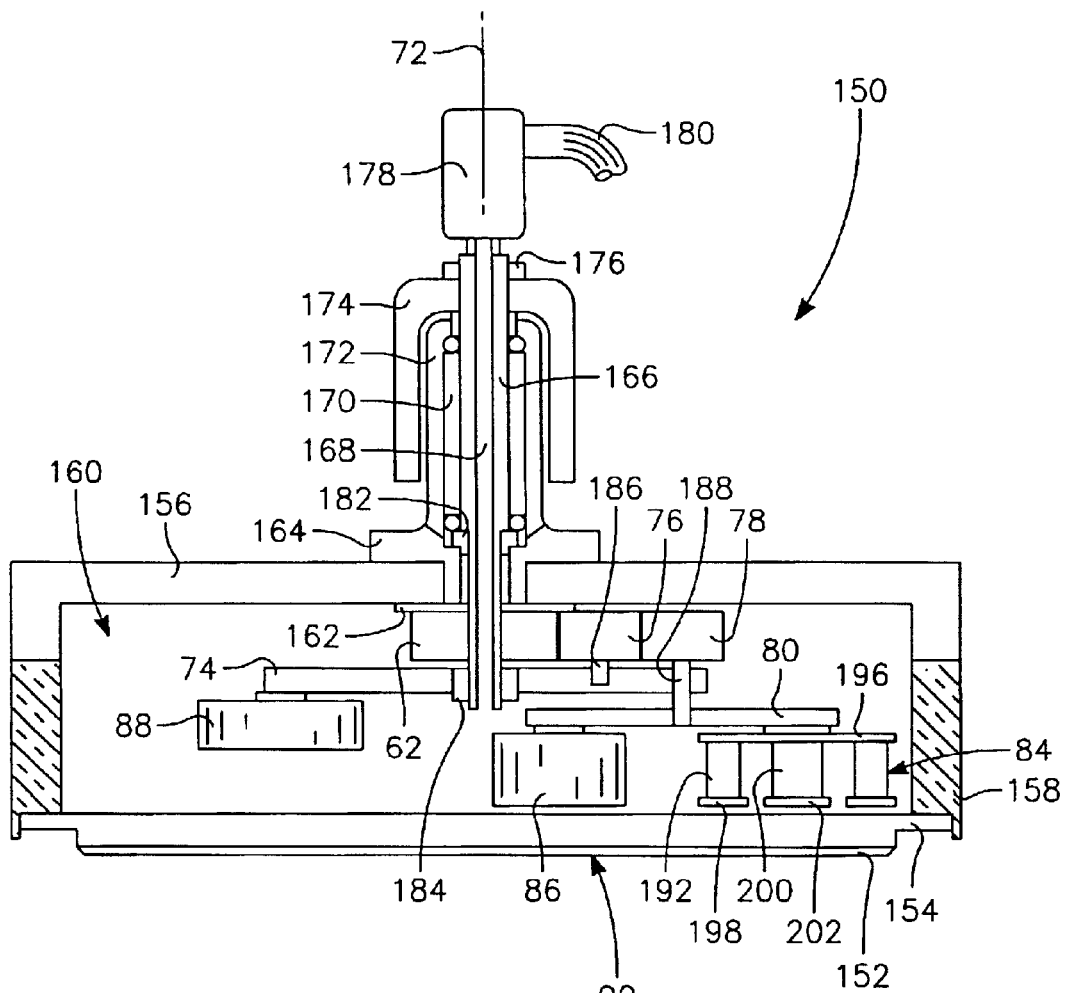
FIG. 10 is a sectioned side view of the magnetron assembly used in the sputter reactor of FIG. 9.

A more detailed cross-sectional view of a magnetron assembly 150 is illustrated in FIG. 10. The target 90 includes a target layer 152 of the material to be sputtered attached to a target backing plate 154. In DC magnetron sputtering, the target material is typically metallic so that it can be electrically biased. A top cover 156 is fixed to the target backing plate 154 through a tubular isolator 158 and surrounds and seals a cavity 160 in which a water-cooled magnetron rotates. The isolator 158 allows the target 90 to be electrically biased while the top cover 156 and magnetron elements attached to it remain grounded for reasons of safety.

On the side of the magnetron 150 opposite the target 90, a bottom ring 162 and a mounting flange 164 are fixed to opposite sides of the top cover 156, and a rotatable drive shaft 166 with a central bore 168 passes through them. A ball-bearing sleeve 170 rotatably supports the drive shaft 166 inside a cup housing 172 fixed to the mounting flange 164. A drive bell 174 is fixed to the drive shaft 168 between retainer nuts 176 and is rotated by unillustrated gears and motor to rotate the drive shaft 166. A rotary union 178 is supportably held on the top of the drive shaft 166 to allow cooling water or other fluid to flow into the shaft bore 168 through a water hose 180 and thence into the cavity 160. An unillustrated water outlet penetrates the top cover 160 to allow the recirculation of cooling water. A rotary retainer ring 182 between the drive shaft 168 and the mounting flange 164 seals the cooling water within the cavity 160.

Unillustrated screws attach the fixed gear 62 to the bottom ring 162 and hence to the top cover 156. A clamp ring 184 is clamped to the bottom of the drive shaft 168 and is fixed to the drive plate 74. The main counterweight 88 is supported on a first end of the drive plate 74. The idler gear 76 is fixed to an idler shaft 186 which is rotatably supported in the second end of the drive plate 74. Respective sets of intermeshing teeth engage together the fixed and idler gears 62, 76. Similarly, the follower gear 78 is fixed to a follower shaft 188 rotatably supported farther out on the second end of the drive plate 74, and intermeshing teeth engage together the idler and follower gears 76, 78. The bottom plate 80 is fixed to the end of the follower shaft 188 below the drive plate 74 and rotates with the planetary motion of the follower gear 78.

Figure 11:
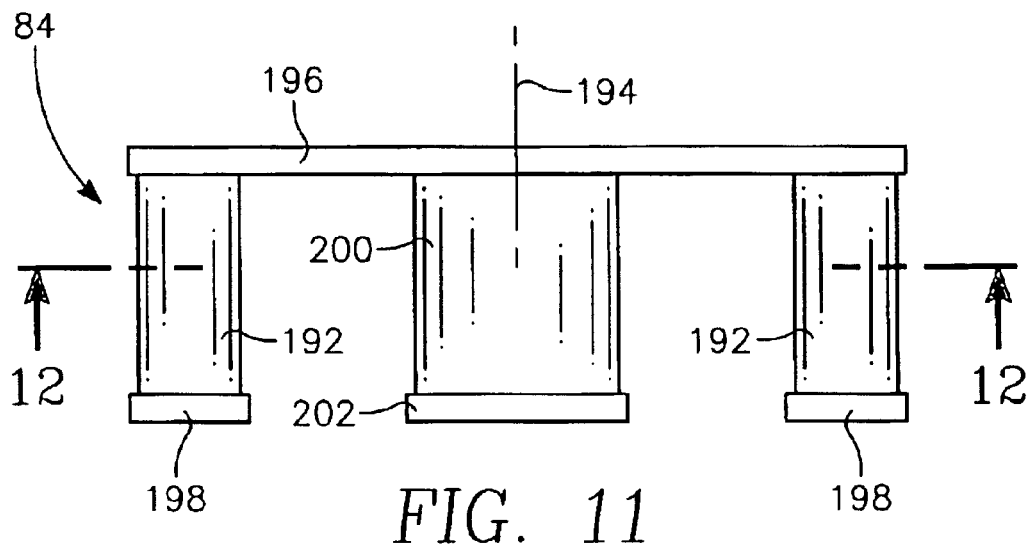
FIG. 11 is a cross-sectional view of an unbalanced circularly symmetric magnet assembly.
Figure 12:
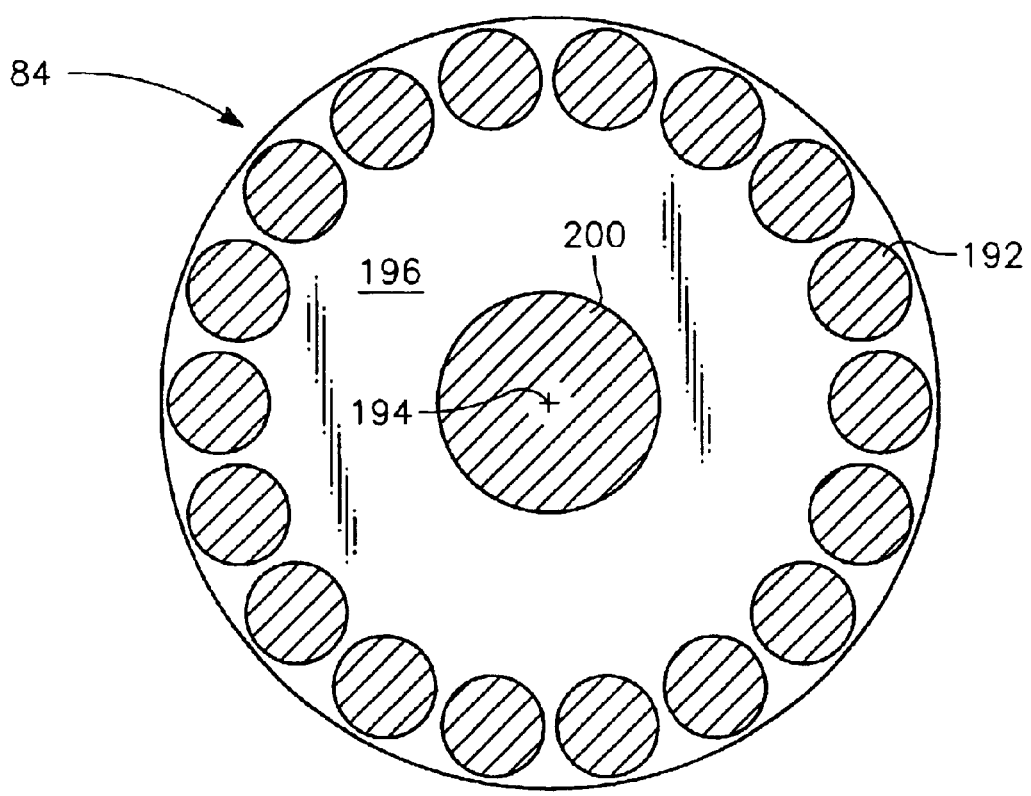
FIG. 12 is a bottom view of the magnet assembly of FIG. 11 taken along view line 12—12.

The magnet assembly 84 may be circularly symmetric, as is more clearly illustrated in cross-sectional views from the side in FIG. 11 and from the bottom in FIG. 12. It has a total area of preferably no more than 10% of the area of the target being scanned, even more preferably less than 5%. Even a magnet assembly with an area ratio of less than 2% has demonstrated reasonably good uniformity in a planetary magnetron. Although there may be other countervailing considerations, a circular magnet assembly maximizes magnetic field strength for a given size and type of magnetic material.

A large number of cylindrical outer magnets 192 of a first magnetic polarity along the cylindrical axes are arranged in a circular pattern about a magnetic center axis 194. They are supported by a circular magnetic yoke 196, for example, of a magnetically soft stainless steel, which in turn is fixed to the bottom of the planetary bottom plate 80 at a central support point. The bottom, free ends of the outer magnets 192 are covered and magnetically coupled by an annular magnetic pole piece 198. A cylindrical inner magnet 200 of the opposed magnetic polarity is positioned in the center of the circular array of outer magnets 192 and is supported by the magnetic yoke 196, which also magnetically couples the inner magnet 200 to the outer magnets 192. The bottom end of the inner magnet 200 is preferably though not necessarily covered by a circular pole piece 202. The magnets are typically encapsulated in stainless steel packages having end tips which are captured by holes in the magnetic yoke 196 and the pole pieces 198, 202. Unillustrated screws fix the pole pieces 198, 202 to the yoke 196 with the magnets 198, 200 sandwiched between them. The total magnetic strength of the combined outer magnets 192 is greater than that of the inner magnet 200 by a factor of at least 1.5 and preferably more than 2, resulting in the magnet assembly 84 being unbalanced. If the same magnetic material is used for all the magnets, the total magnetic strength, which is the magnetic flux integrated over surface area, is proportional to the total cross sectional area of the outer magnets 202 or inner magnet 200. It is appreciated that the inner magnet 200 may be subdivided into multiple cylindrical magnets with a common center pole piece 202. Although this configuration provides less magnetic strength because of its lower packing factor, this loss is less critical for the weaker inner pole of an unbalanced magnetron.

The width of the magnet assembly 84 should be considered in determining full target coverage. One condition for full coverage is that $$A_2 + \frac{D_M}{2} \geq A_1,$$

where $D_M$ is the diameter of the outer magnetic parts of the magnet assembly 84 about the center 194, that is, the encircling diameter of the outer pole pieces 198, although a better but less quantifiable radius is that of the toroidal magnetic components to be described later. However, the general result of realistic modeling of finite magnetron diameters confirmed by experiments is that the target center is over sputtered. Accordingly, for full and uniform target erosion, the edge of the magnetron should at barely graze the target center, that is, $$A_2 + \frac{D_M}{2} \leq A_1.$$

Furthermore, uniform film deposition is likely to be more important than uniform target erosion. In the case of metallization sputtering, for example, of copper or aluminum, uniform film deposition is sometimes optimized by essentially not sputtering the very center of the target. In this situation, the sputtered copper may well redeposit at the target center resulting in negative erosion. But since redeposited copper is relatively stable, the redeposition is generally not considered a problem. However, in the case of refractory metals, such as Ta, Ti, and W used for barrier layers particularly in combination with reactive sputtering of their nitrides, redeposition presents a significant particle problem. The redeposited refractory metal or refractory nitride exhibits high internal stress and is likely to flake off if the redeposited layer significantly thickens. Accordingly, for sputtering of refractory metals, the target should be kept clean by sputtering over the entire target area to a degree sufficient to prevent net redeposition. That is, the magnetron should come relatively close to the target center even if the target is being over sputtered near its center.

Figure 13:
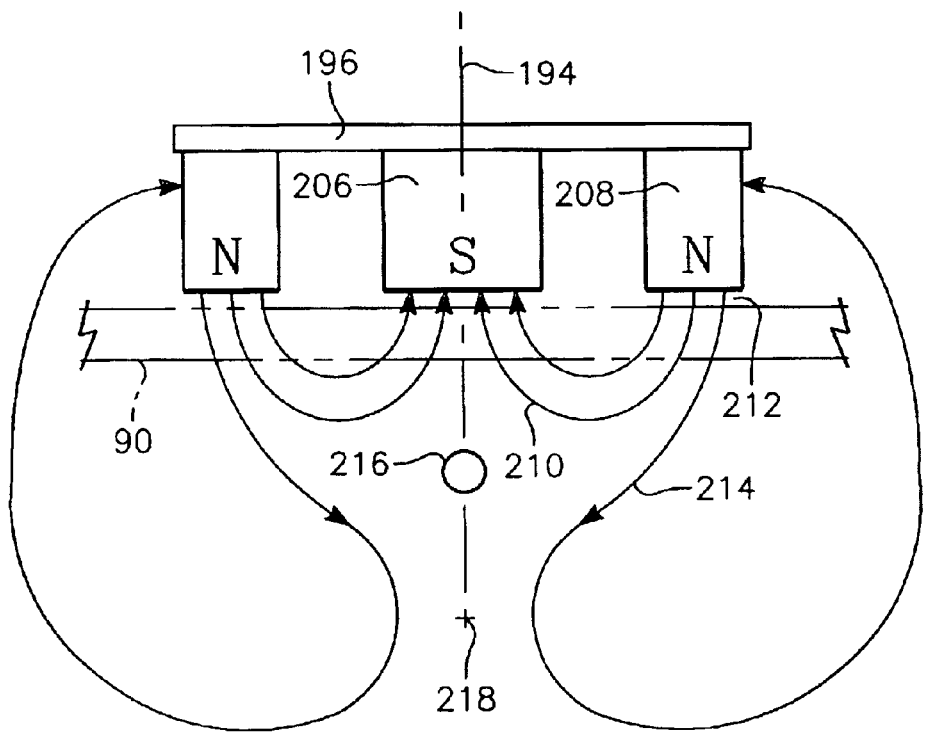
FIG. 13 is a schematic illustration of the magnetic field distribution produced by a unbalanced circular magnetron.

A circular unbalanced magnet assembly provides several advantages for uniform sputtering into high-aspect ratio holes. As schematically illustrated in FIG. 13, an unbalanced circular magnet assembly includes an inner pole 206 of one magnetic polarity surrounded by a stronger outer pole 208 of the other polarity and both generally circular symmetric about the center axis 194. The circular magnet assembly produces a magnetic field distribution also symmetric about the axis 194. The magnetic field distribution includes semi-toroidal components 210 following a smooth path from the outer pole 208 to the inner pole 206. The faces of the poles 206, 208 are placed closely to the back of the target 90 with a gap 212 of minimum size between them. As a result, some of the semi-toroidal components 210 extend generally in parallel to the front face of the target 90. The parallel magnetic field traps electrons and greatly increases the density of the plasma adjacent the target. The semi-toroidal components 210 are symmetric about the magnetic center axis 194 and form a closed loop for trapping the plasma electrons, thus reducing electron loss. The dual-counterbalance design of the magnetron of FIGS. 5 and 6 reduces jitter and vibration and hence allows the gap 212 to be decreased in contrast to the Freeman design in which the planetary rotation is not counterbalanced.

The magnetic field distribution also includes components 214 projecting from the stronger outer pole 208 far from the target 90 towards the wafer being sputter coated. The projecting components 214 emanating from the stronger outer pole 208 curve towards the center line 194 of the magnet assembly as they approach the wafer before returning to the back of the outer pole 208 or the back yoke 196. The projecting components 214, which result from the magnetron unbalance, both extend the plasma and guide the ionized metal atoms to the wafer. In a circular magnet assembly, the projecting components 214 are also circularly symmetric and do not favor either the inner or outer portions of the wafer, particularly after the full planetary motion is considered. Furthermore, the circular geometry allows the unbalance of the magnets to be maximized, thus allowing an increase the projecting components without decreasing the semi-toroidal components 210 which increase the plasma density. Electron loss is also reduced in a circular configuration. Lastly, the unbalanced magnetron creates a null 216 as well as a local maximum 218 in the magnetic field distribution. The null 216 traps electrons to a very high density. When neutral sputtered metal atom pass through the highly ionized null 216, they tend to collide with the electrons and to become ionized, thus increasing the metal ionization fraction.

Figure 14:
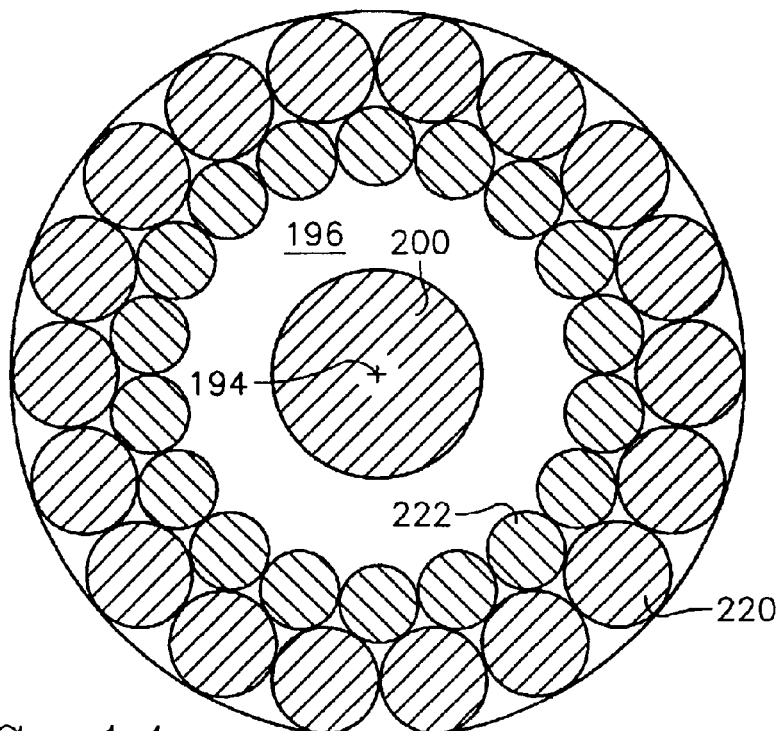
FIGS. 14 and 15 are cross-sectional bottom views of two alternative circularly symmetric magnet assemblies.
Figure 15:
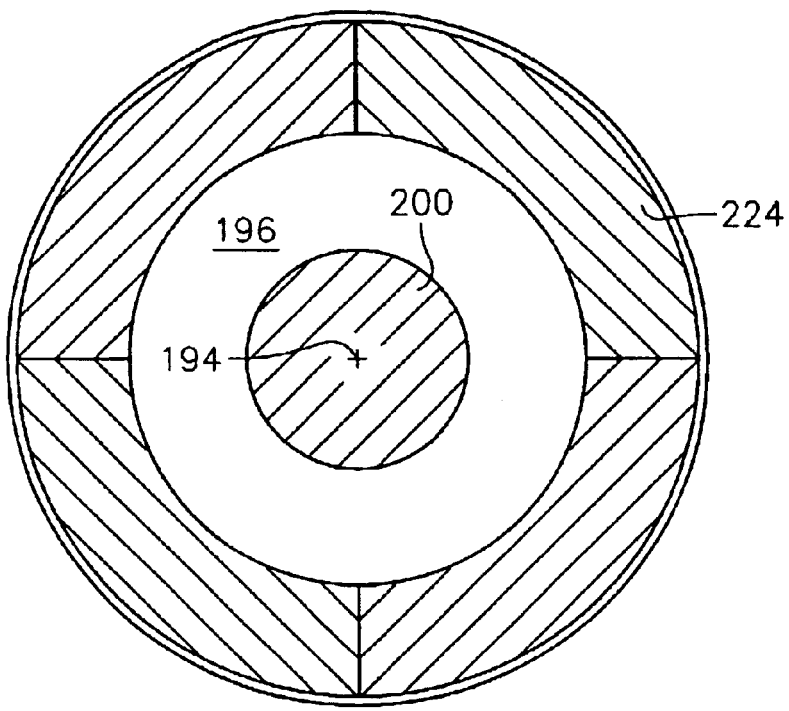

Several variants are available for the magnetron 100 of FIGS. 11 and 12. The cylindrical center magnet 200 may be replaced by multiple smaller magnets, preferably numbering three, four, or seven, the last being in a hexagonal close packed arrangement. For special effect, the cylindrical center magnet 200 may be replaced by a tubular inner magnet with an annular pole piece. The outer magnets 192 may be replaced, as illustrated in the sectional view of FIG. 14, by two annular rows of magnets 220, 222 covered by a single annular pole piece 198. Preferably, the outer magnets 220 are of slightly larger size so that the multiple rows can be close packed. Alternatively, as illustrated in the sectional view of FIG. 15, the outer magnets 212 are replaced by an annular band of arc-shaped magnets 224 magnetized in a single direction along the axis 194 and having a generally rectangular cross section along the azimuthal direction. Preferably, the magnets 224 number two or more to facilitate their fabrication. Either arrangement increases the magnetic density of the outer magnetic pole, thus allowing an increase in unbalance in the magnetron, thus increasing the projecting magnetic field, without sacrificing the important semi-toroidal component adjacent the face of the target. The increased projecting magnetic components greatly promote deep hole filling and other sputtering efficiencies. Also, the increased density of the outer pole allows a smaller magnetron without compromising the location of the null. The ratio of the outer to inner magnetic intensities thus are advantageously increased to above 3 or even above 5.

Although the embodiment described above include an innermost gear 62 fixed with respect to the top cover 186 of FIG. 10, it is to be appreciated that an additional rotation of the innermost gear 62 about the center axis 72 causes it to rotate relative to the top cover 186 and to provide additional rotation with respect to the drive plate 74 with little impact upon the rest of the design. Although this embodiment complicates the mechanical design in requiring two coaxial rotations about the central axis 72 or a second offset drive shaft with a geared engagement with the innermost gear 62 as well as attendant rotary seals and rotary drives, the additional independent rotation provides additional flexibility of operational control without the need to change mechanical parts. For example, it may desirable to provide a reactor capable of depositing relatively thin barrier or seed layers during an integral number of full-coverage cycles discussed with respect to FIG. 8 under slightly varying conditions. A variable speed shaft supporting the innermost gear 62 allows the pattern of FIG. 8 with respect to a fixed target 90 to cycle an integral number of times for different sputtering periods. That is, a single magnetron assembly can be optimized for use with different barrier/liner applications. Further, the same magnetron assembly can be optimized for use for thicker blanket depositions requiring long deposition times, thus enabling a universal magnetron for disparate applications.

Figure 16:
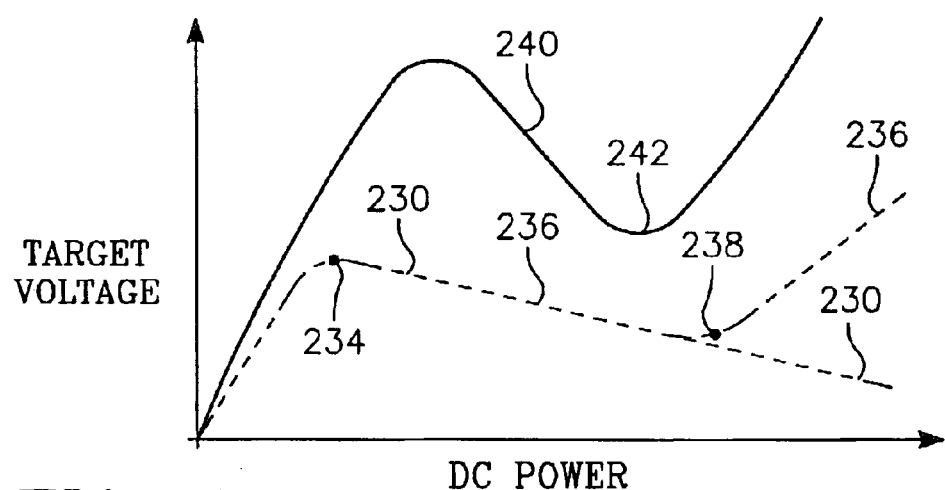
FIG. 16 is a chart plotting the electrical characteristics produced by three types of magnetrons.

The operation of the inventive magnetron can be explained with reference to the graph of FIG. 16 which plots for three different magnetrons when used in a plasma sputter reactor the respective target voltage as a function of the amount of DC power applied to the target, thus in some sense plotting the plasma impedance as a function of power. A conventional magnetron producing a relatively lower density plasma and a much lower ionization fraction for the metal atoms exhibits a voltage vs. power characteristic curve 230 which rises to a peak 234 and then falls monotonically back toward zero over any useful power range. A circumferentially scanned triangular SIP magnetron, which needs to be moderately large to extend from the center to the edge of the target, produces a medium density plasma and a moderate ionization fraction, perhaps of 20%. Its characteristic curve 236 also falls monotonically from the peak 234 but only until a transition point 238 is passed. Above the transition point 238, the target voltage begins to rise. The rise above the transition point 238 is believed to be caused by the increased density of metal ions. Operation above the transition point 238 is desired to produce a high metal ionization fraction, which promotes sputtering into high aspect-ratio holes.

The very small magnetron, for example, having the structure of FIGS. 11 and 12, usable with the planetary motion of the invention exhibits a characteristic curve 240 similar to that of the SIP magnetron. However, its transition point 242 occurs at a substantially lower power. This indicates that it produces a yet higher metal ionization fraction. The lower transition point 242 further also allows operation in the desired regime with a substantially reduced amount of power.

Figure 1:
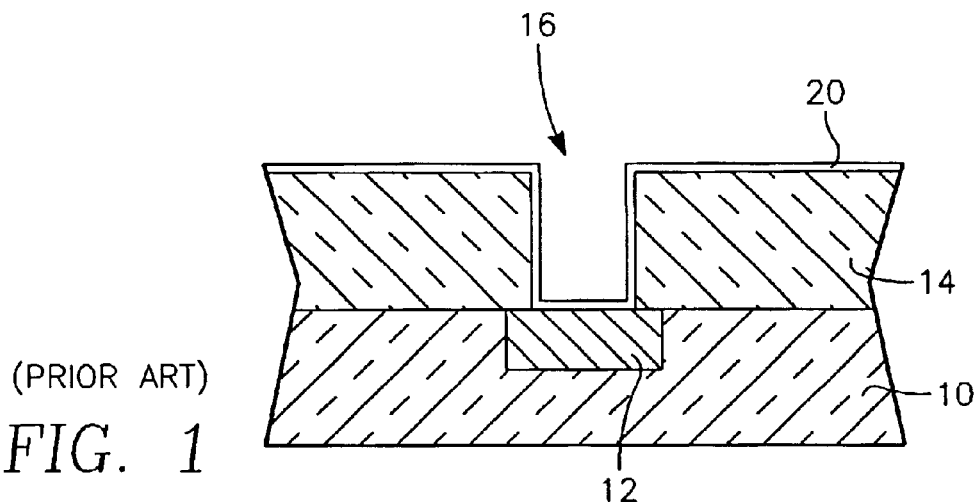
FIGS. 1 and 2 are cross sectional view of integrated circuit via structures to which the sputtering apparatus of the invention may be applied.
Figure 2:
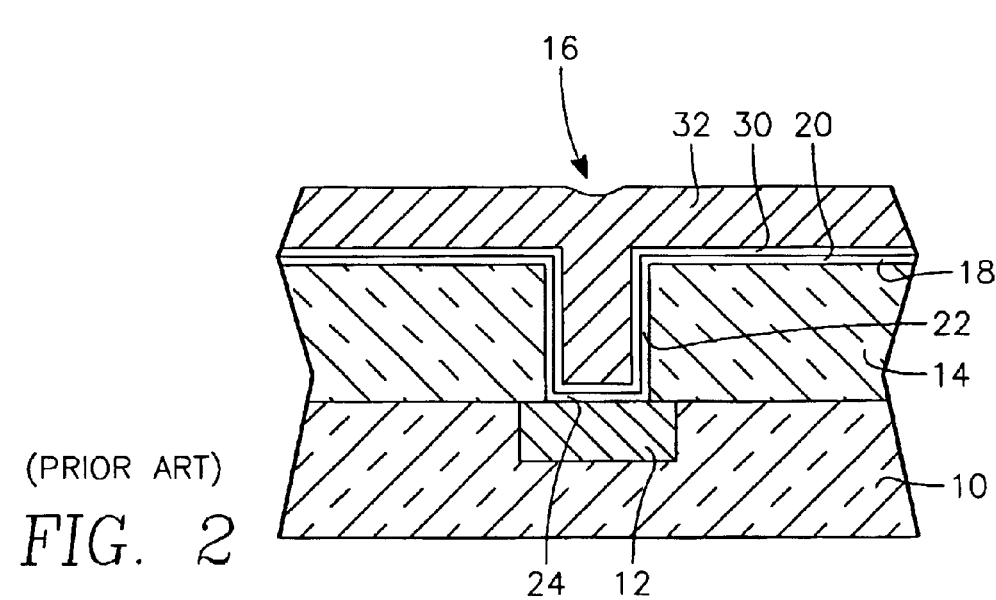
Figure 3:
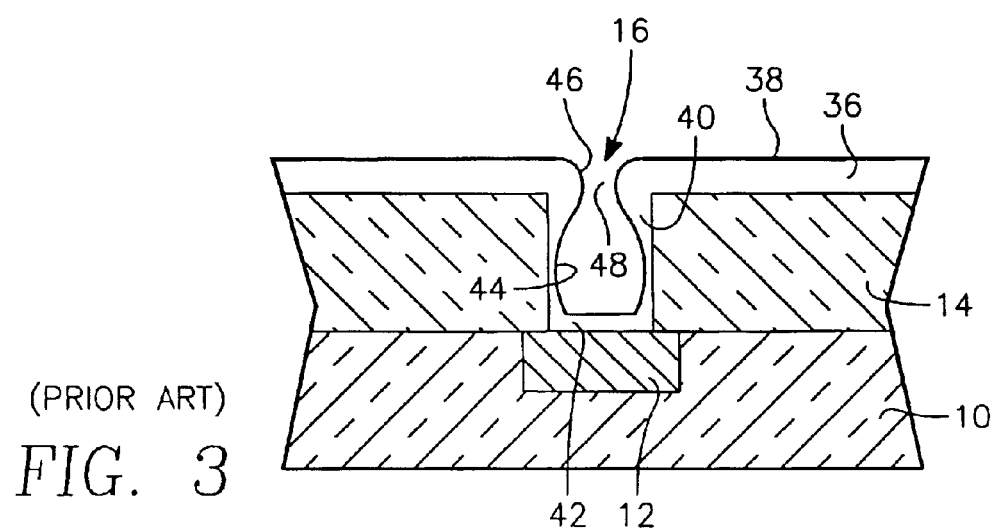
FIG. 3 is a cross sectional view of a via structure showing the typical types of non-uniformity of sputter deposition.
Figure 4:
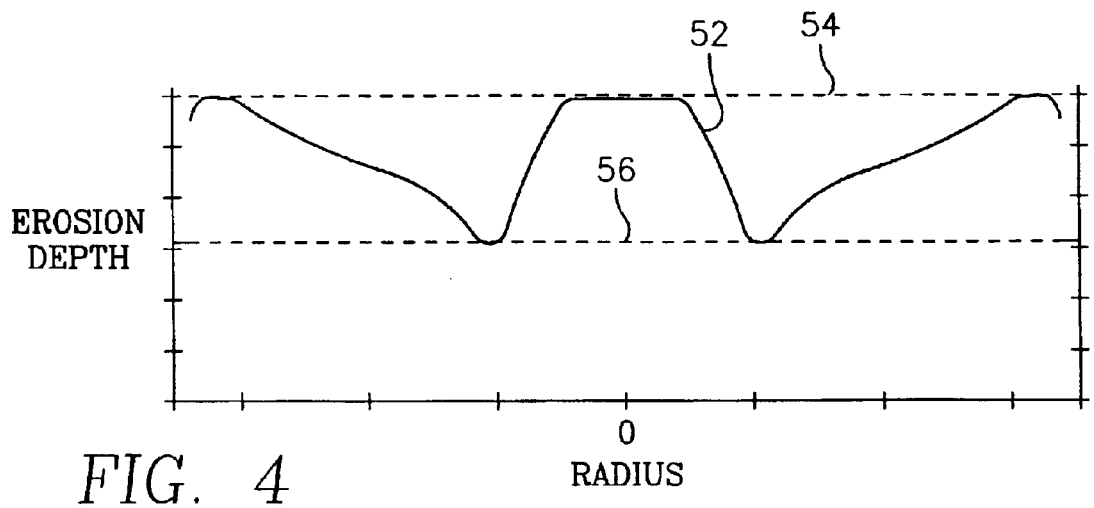
FIG. 4 is a plot of a radial erosion pattern of a sputtering target.

The magnetron 60 has been used to coat metal into high aspect-ratio holes using the general type of sputter reactor 100 shown in FIG. 9 but having a longer throw than illustrated, in particular, 400 mm of separation between the target 90 and a 300 mm wafer 120. The first arm length of the planetary magnetron was 117.5 mm, the second arm length was 53.3 mm, and the magnet diameter was 117 mm. The fixed gear had 35 teeth and the follower gear had 22 teeth. Performance has been observed to be superior with bias power of between 600 and 900 W. With reference to FIG. 3, the greatest improvement over conventional or even SIP magnetrons is a significant reduction in the overhangs 46. This improvement will enable sputtering into holes having even higher aspect ratios. Further, the minimum sidewall thickness 42 has been increased to above 5 nm for 124 nm field thickness and is more uniform. The thickness of the bottom portion 42 has also increased to at least 40 nm.

These effects are believed to all derive from the higher plasma densities achievable with a smaller magnet assembly. Further, the asymmetry of sidewall coverage near the wafer periphery decreased, indicating a higher ionization fraction. Higher bias power further reduced the overhangs, but portions of the sidewall became too thin.

The trajectory for planetary motion is easily calculated as a complex position r in a complex plane having its origin at the target center. The position x of the object executing planetary motion is given by $$x = A_1 e^{i\omega_1 t} + A_2 e^{i\omega_2 t},$$

where with little loss of generality $A_1$ and $A_2$ are real positive numbers representing the lengths of the primary and secondary moment arms, $\omega_1$ is the rotation rate of the drive plate expressed in radians per second, and $\omega_2$ is the rotation rate of the follower gear with reference to fixed coordinates. For planetary motion expressible as a gear ratio G or other engagement ratio, the two rotation rates are related by $$\omega_2 = (1+G)\omega_1.$$

For forward planetary motion, the gear ratio G is positive while it is negative for retrograde planetary motion. Let the ratio of the arm lengths be represented by $$R_A = \frac{A_2}{A_1}$$

so that the position may be expressed as $$x = A_1 e^{i\omega_1 t}\{1 + R_A e^{+iG\omega_1 t}\}.$$

The complex velocity v is the time derivative of the position x, which is given by $$v = \dot{x} = i\omega_1 A_1 e^{i\omega_1 t}\{1 + e^{iG\omega_1 t} R_A(G+1)\}.$$

To return to real values, the square of the magnitude of the velocity, that is, the square of the speed is given by $$|v|^2 = vv^*$$
$$= \omega_1^2 A_1^2 \{1 + R_A^2(G+1)^2 - R_A(G+1)(e^{iG\omega_1 t} + e^{-iG\omega_1 t})\}$$
$$= \omega_1^2 A_1^2 \{1 + R_A^2(G+1)^2 - 2R_A(G+1)\cos G\omega_1 t\}.$$

The maximum and minimum velocities occur when the cosine terms are plus or minus one. Which is which depends on the sign and magnitude of G. While a discussion of maximum and minimum velocities may be interesting, it does not directly address target erosion.

The real requirement for uniform target sputtering is based on radial velocities with respect to the central axis rather than tangential velocities along a path. For equal coverage, the time $\Delta t$ that the (infinitely small) magnetron spends in an annular band of radius r of width $\Delta r$ is proportional to r. The azimuthal velocity parallel to the annular band is not directly relevant for uniform sputtering. As a result, the desired radial velocity is given by $$\dot{r} = \frac{\Delta r}{\Delta t} = \frac{1}{r}.$$

The differential equation is solved by simple integration and results in $$r = \sqrt{t}$$

and $$\dot{r} = \frac{1}{\sqrt{t}} = \frac{1}{r}.$$

The last equation is equivalent to $$\frac{dr^2}{dt} = 1.$$

These equation have not clearly accounted for constants and signs.

Returning to the complex algebra, the square of the time variable radius for planetary motion is given by $$r^2 = xx^*$$
$$= A_1^2\{1 + R_A^2 + R_A(e^{iG\omega_1 t} + e^{-iG\omega_1 t})\}$$
$$= A_1^2\{1 + R_A^2 + 2R_A \cos G\omega_1 t\}$$
$$= A_1^2 + A_2^2 + 2A_1 A_2 \cos G\omega_1 t.$$

Figure 17:
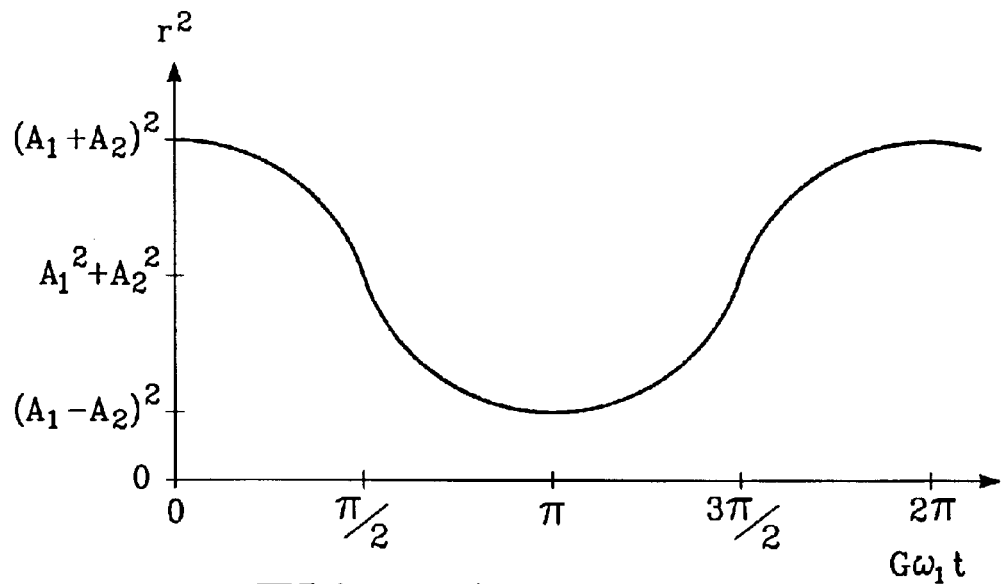
FIG. 17 is a plot of the calculated radial position as a function of time for one-stage planetary motion.

This equation can also be derived from the law of cosines. This function is plotted in FIG. 17 for the case $A_1 > A_2$. For $A_1 < A_2$, the same dependence is observed but the order of the difference on the ordinate axis is reversed. Interestingly, except for changing the periodicity, the same dependence is obtained for any value of the gear ratio G, whether positive or negative, that is, whether for retrograde or forward planetary motion. Nonetheless, integral values need to be avoided to assure a precessing pattern.

The time derivative is $$\frac{dr^2}{dt} = -2GA_1 A_2 \omega_1 \sin G\omega_1 t.$$

Figure 18:
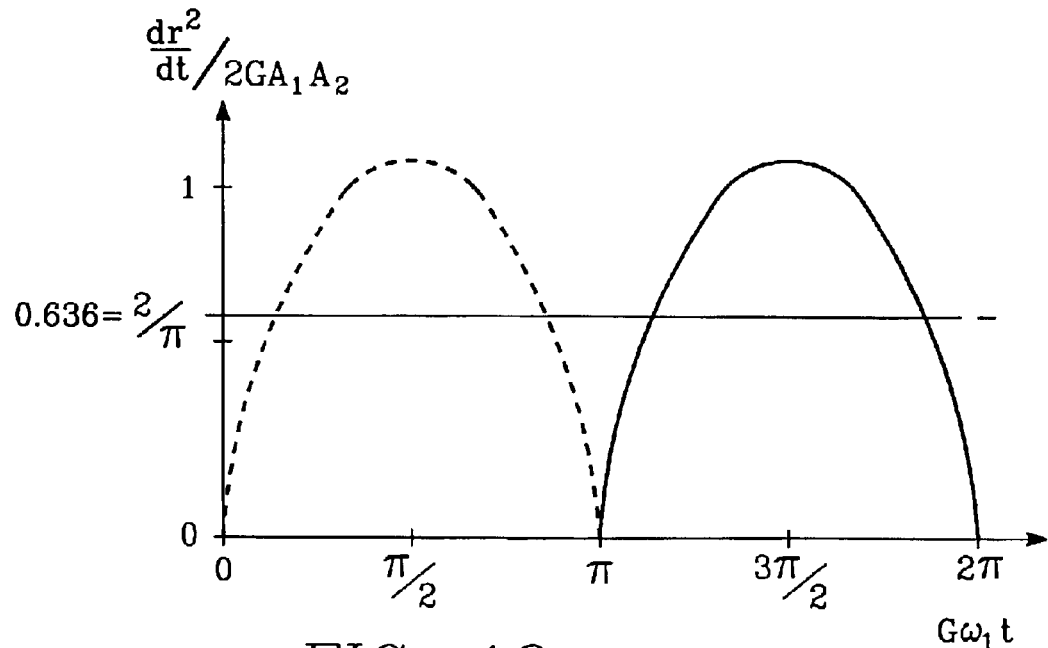
FIG. 18 is a plot of the calculated square of velocity as a function of time for one-stage planetary motion.

This quantity is plotted in FIG. 18 with negative values shown by dashed lines. Again, the waveform is independent of G except for periodicity and amplitude. The function varies around zero, but it is noted that only its magnitude is significant for coverage effects. The plot has also been normalized to a maximum value of 1, and its average magnitude is $2/\pi$. As demonstrated for the above solution for the differential equation, the quantity plotted in FIG. 18 should be constant for uniform coverage over the trajectory. Although this quantity is clearly not constant in time or over the radius, we need to establish the degree of variation from the average value and whether it is significant.

First of all, the above derivations are based upon a point-sized magnetron when in fact the magnetron effectively extends over a diameter D, which is typically somewhat more or less than the physical outer diameter of the circular magnetron and depends upon the degree of imbalance and the size of the magnetron. As a result, the plot of FIG. 17 should be smeared out. For example, at the minimum radius $A_1-A_2$, the magnetron actually extends closer to the center r=0 though with reduced effect since only a portion of the magnetron extends on that side. Similarly at the maximum radius $A_1+A_2$, the magnetron extends with reduced effect further outwardly.

Figure 19:
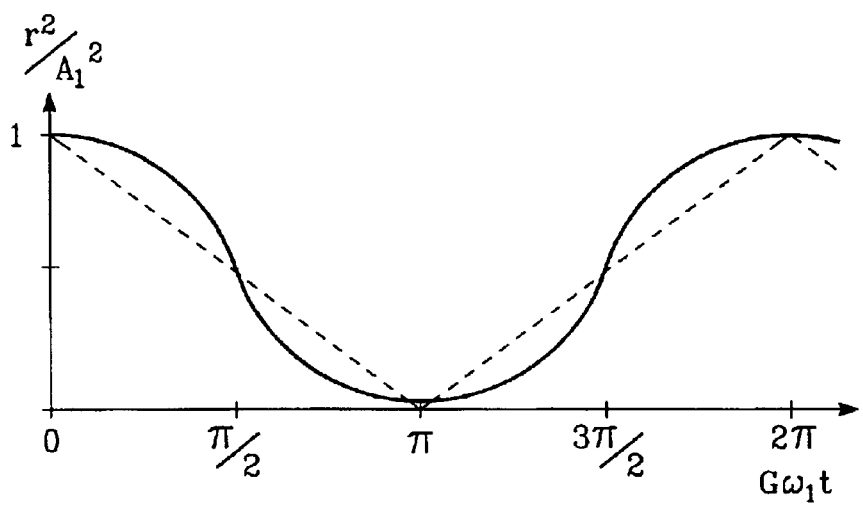
FIG. 19 is schematic plot based on FIG. 17 of the calculated planetary radial position and the desired position as a function of time.

Secondly, the deviation of the radial velocity from a constant value is not all that great over most of the trajectory. To quantify that effect, the time dependence of the square of the radial position is plotted in FIG. 19 for the case of $A_1 = A_2$. The ideal time dependence derived from the above differential equation is plotted by the sawtooth waveform. This shows that the magnetron is spending too much time both near the center and near the periphery. The same conclusion can be derived from the plot of FIG. 18.

A better measure of the error associated with the erosion pattern expresses $dr^2/dt$ in terms of the radius r. The derivation including unequal arm lengths is simplified by normalizing t to $G\omega_1 t$ and normalizing r to $$r/\sqrt{2A_1 A_2}$$

and using a dimensionless parameter $$\alpha^2 = \frac{1}{2}\left(\frac{A_1}{A_2} + \frac{A_2}{A_1}\right),$$

which is unity for equal arm lengths. The two radial equations are then expressed as $$r^2 = \alpha^2 + \cos t$$

and $$\frac{dr^2}{dt} = -\sin t,$$

which are combined to produce $$\frac{dr^2}{dt} = -\sin(\cos^{-1}(r^2 - \alpha^2))$$
$$= -\sqrt{1 - (r^2 - \alpha^2)^2}.$$

Figure 20:
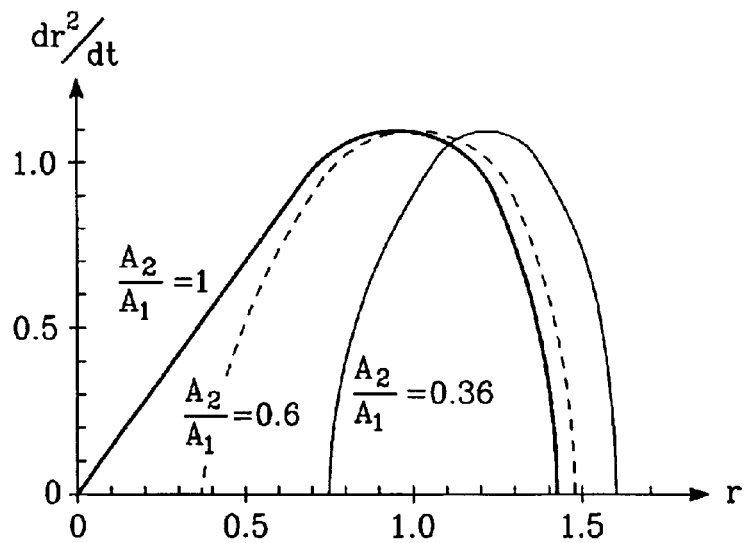
FIG. 20 is a plot of the calculated square of the radial velocity versus radius for one-stage planetary motion and for two ratios of arm lengths.
Figure 21:
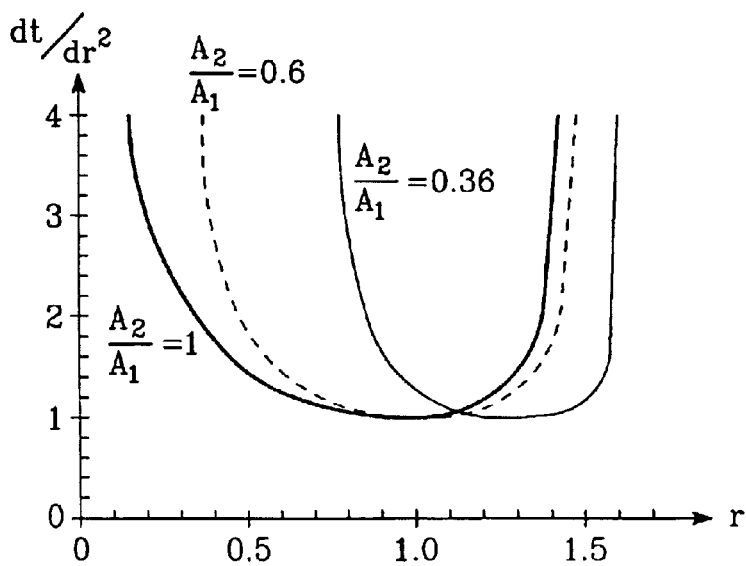
FIG. 21 is a plot of the inverse of square of the radial velocity of FIG. 20.

The minus sign in front of the radical disappears if t is shifted by π. This time derivative is plotted in FIG. 20 as a function of normalized radius for two ratios of the arm lengths. In fact, the same plots result for the inverse of the ratios. A more direct function for consideration of the target erosion profile is the inverse of the time derivative, as plotted in FIG. 21. The singularities at both the inner and outermost points will be smoothed out when a finite magnetron diameter is included. Nonetheless, both the innermost and outermost portions of the target are being excessively eroded. One further conclusion is that a non-unity arm ratio $A_2/A_1$ reduces the extent of the singularity at the innermost point. For these reasons, a preferred embodiment uses a non-unity arm ratio and a moderately large magnetron that nearly grazes but does not touch the target center axis.

Auxiliary coaxial magnets can further improve performance by enhancing the projecting field produced by the unbalanced magnetron. As illustrated in the schematic cross-sectional view of FIG. 22, a reactor 250 includes an adapter 252 extending and effectively forming part of the chamber sidewall 102. The adapter 252 is used to easily vary the throw between the target 90 and the wafer 120. An electromagnetic coil 254 is wrapped around the outside of the adapter 252 coaxially with the center axis 70. A DC power supply 256 provides a controlled amount of current through the coil 254 to produce a generally vertical magnetic field within the chamber which is parallel to and reinforces the magnetic field projecting into the chamber from the stronger outer pole 208 of the unbalanced planetary roof magnetron 60.

Figure 23:
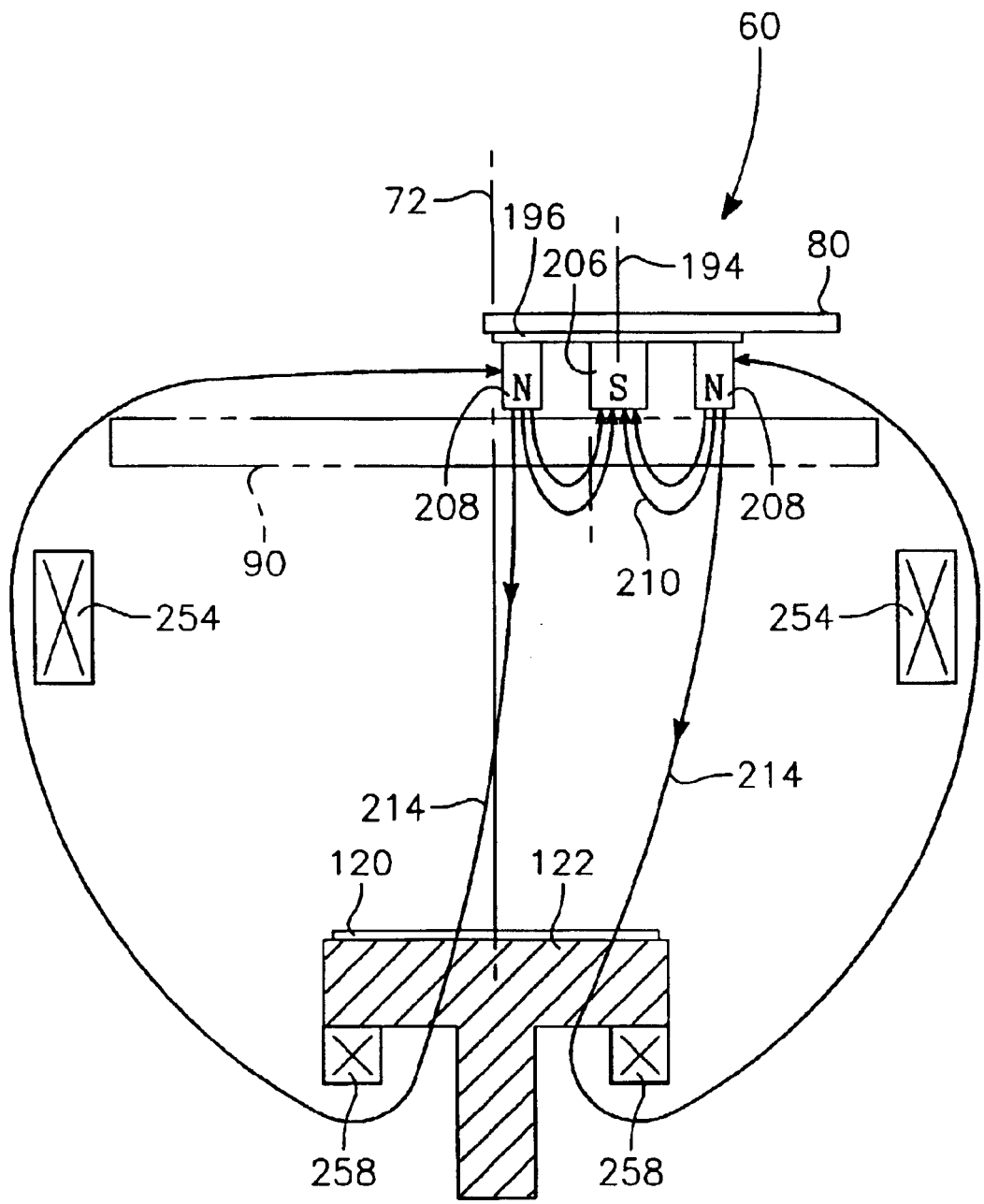
FIG. 23 is a schematic view of the magnetic field produced in the sputter reactor of FIG. 22.

As a result, as illustrated schematically in FIG. 23, the projecting field 214 extends farther into the chamber towards the wafer 120 before returning to the back of the outer pole 192. The effect is further enhanced by another coaxial electromagnetic coil 258 placed in back of the wafer pedestal 122 and powered by another DC power supply 260 to create a generally vertical magnetic field which is parallel to and reinforces the projecting magnetic field from the magnetron's outer pole 208. The lower electromagnetic coil 258 has a small radial size than the upper electromagnetic coil 254 and serves to focus the projecting magnetic field towards the wafer 120 before it returns to the magnetron's outer pole 208 from in back of the wafer. The bore of the side electromagnetic coil 254 is substantially larger than the diameter of the wafer 120 while the bore of the bottom electromagnetic coil 258 is typically slightly less. A bore has its sides completely encompassed by the associated electromagnetic coil. The coils 254, 258 cause the projecting magnetic field 214 to extend from the planetary roof magnetron 60 to the wafer 120 and to thus guide the metal ions all the way to the wafer 120. The magnetic fields illustrated in FIG. 23 are not complete. For example, the figure does not show the solenoidal fields more tightly encircling the coils 254, 258 creating them. Preferably the ratio of the bores of the two coils 254, 258 is at least 1.5 and more preferably at least 2.0 to achieve a focusing effect.

Figure 22:
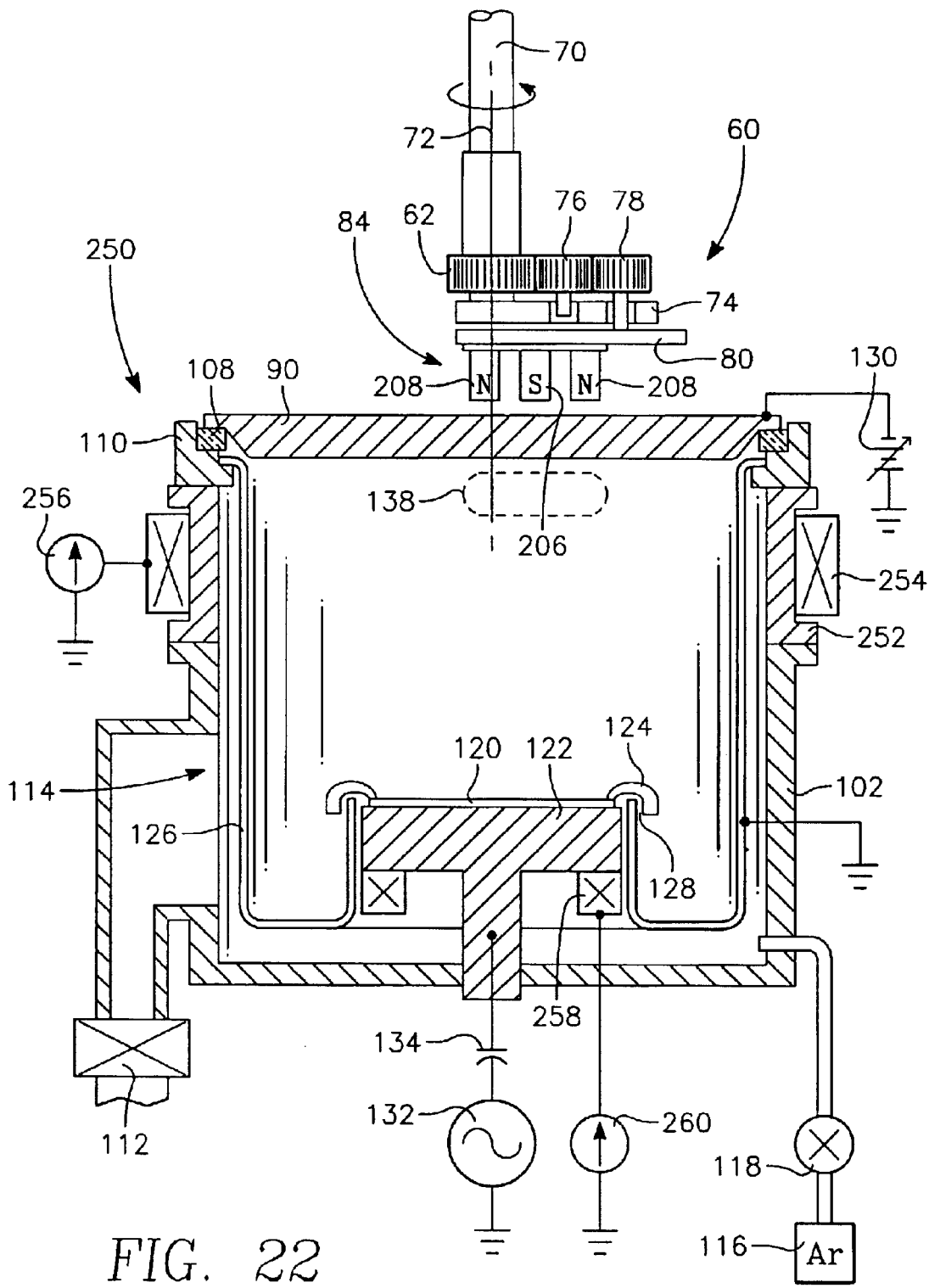
FIG. 22 is a schematic side view of a sputter reactor including a planetary magnetron and auxiliary coaxial coils.

The side coaxial coil 254 illustrated in FIG. 22 extends only in the upper half of the processing space between the target 90 and the pedestal 122. Other coil configurations are possible. For example, a long side coil provides a more homogeneous magnetic field extending from the target 90 to the wafer. Such a field will collimate the electron flux emanating from the plasma 138 and hence the ion flux that is following the electrons. Nearly the same effect can be achieved by using multiple side coils arranged axially along the chamber sidewall. The combination of a homogeneous field and the smaller back coil 258 to create a convergent field to focus the electron flux and hence ion flux has been used in the electron optics of conventional scanning electron microscopes.

The electromagnetic coils 254, 258 may be used to increase the effective imbalance of the already imbalanced roof magnet assembly 84. Similarly, they may be used to effect an unbalanced magnetron while using a balanced or nearly balanced roof magnet assembly 84, thereby freeing the roof magnetron 60 of the burden of providing the collimating and guiding fields, thereby allowing more freedom in the design of the roof magnetron 60.

The theory presented above, though not accounting for the magnetron diameter and the local magnetic field distribution, nonetheless demonstrates that adjustment of the gear ratio and ratio of arm length has limited utility in increasing full target coverage. One method of improving performance effectively changes the time scale by modulating the rotation rate of the planetary mechanism as the magnetron travels between the periphery and the center of the target. In contrast, the more conventional planetary magnetron rotates the drive plate about the center of the target at a constant rotation rate.

Figure 24:
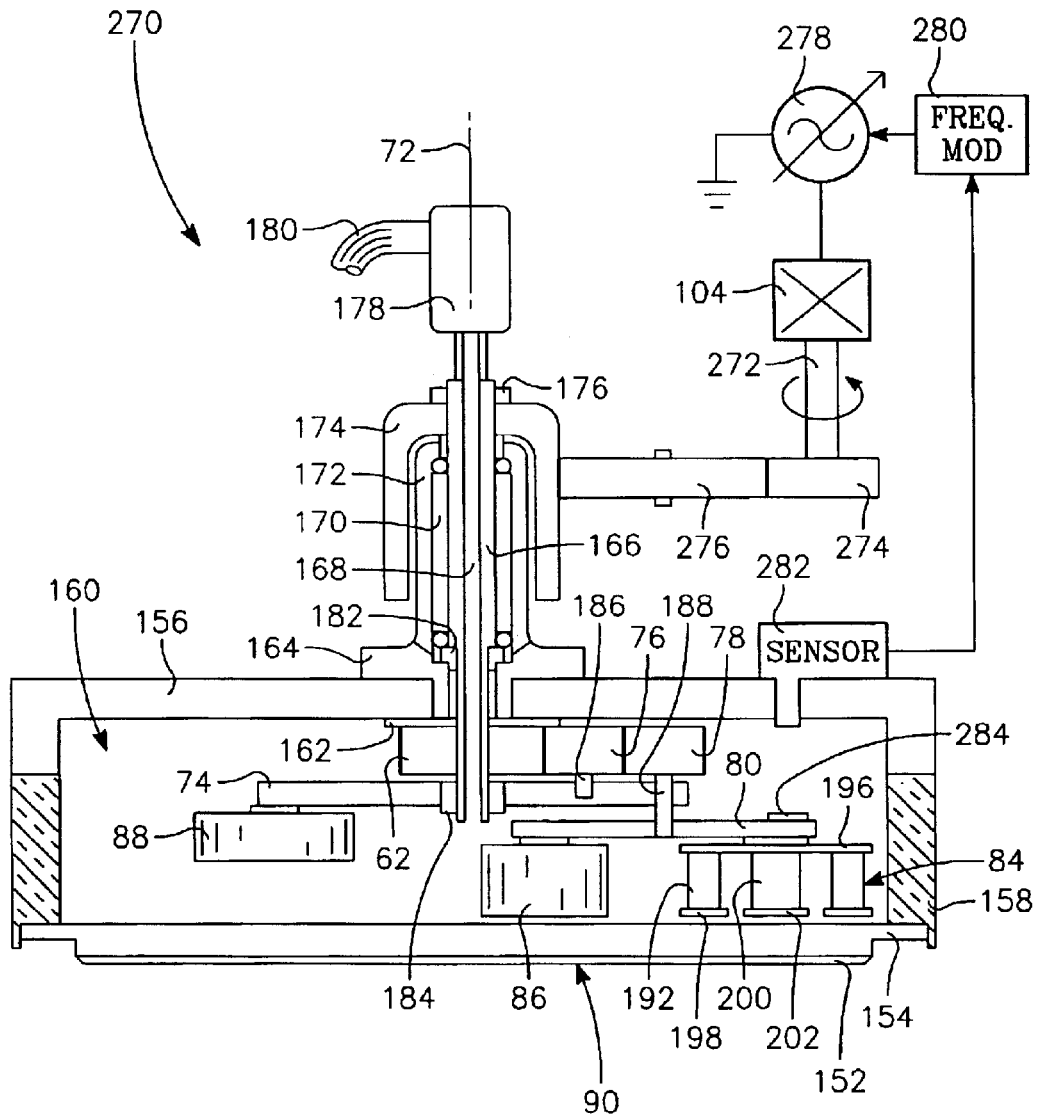
FIG. 24 is schematic side view of a planetary magnetron assembly including modulation of the rotation frequency.

In a magnetron assembly 250 illustrated in the cross-sectional view of FIG. 24, the motor 104 rotating the magnetron 160 has an output shaft 272 coupled to the drive bell 174 through one or more gears 274, 276. The motor 104 is conventionally a brushless AC motor. In this embodiment, it is driven by a variable frequency AC source 278. A frequency modulator 280 controls the frequency of the AC source 278 such that the drive shaft 272 and hence the planetary magnetron 160 rotates faster during some periods of the radial scan than others, for example, faster when the magnet assembly 84 is nearer the center 72 of the target 90. That is, the rotation velocity is modulated during each rotation of the second arm 80 toward and away from the central axis 72. Use of a pulsed stepper motor simplifies the arrangement since the pulse rate can be varied to control the rotation rate around the rotation of the magnet assembly 84. The rotation rate may also be increased near the target periphery, but this does not appear to be as important as near the center. Which portions of the target 90 are scanned longer depend as well upon the size of the magnet assembly 284 and the offset from the target center and periphery.

With most gear ratios, the radial location of the magnet assembly 84 is not directly ascertainable by a rotation position of the drive shaft 166 or its drive bell 174. Accordingly, the modulation must be synchronized with motion of the second arm 80 of the planetary mechanism. Even if the modulation is desynchronized by small fractions of a percent on each revolution, the rapid rotation of the second planetary arm will soon become totally desynchronized. Synchronization is positively controlled according to a position sensor 282 located on the top cover 156 in back of or to the side of the magnet assembly 84 at its outermost position. The sensor 282 detects when a signal emitter 284 connected to the outer part of the second arm 80 or the magnet assembly 84 is near the outer periphery of the planetary path. The sensor may be optical, magnetic, or of other design capable of sensing a closely spaced signal emitter 284. For example, the sensor 282 may include a laser or optical source and a corresponding optical detector. The signal emitter 284 in this case may be a periodic reflective pattern, which will produce a series of optical pulses of well determined period which an electrical filter connected to the optical detector converts to a single synchronizing pulse which the sensor delivers to the modulator 280. Two position sensors may be advantageously used to pretrigger the electronics and to reduce false detections. It is noted that the illustrated position sensor is localized to one sector of the target and does not detect radial position in other sectors. However, if the desynchronization per revolution is relatively small, the resultant occasional position sensing is sufficient.

A second method of sculpting the erosion profile modulates the power applied to the target. The target power is typically DC in most commercial sputter reactors, but although it may be AC or RF in some applications. In the magnetron assembly 290 illustrated in the schematic cross-sectional view of FIG. 25, the DC power source 130 supplying power to the target 90 has its power modulated by a power modulator 292 as synchronized to rotation of the second planetary arm 80 by the position sensor 282. The actual modulation may be in terms of target voltage or current, but typically target bias is specified according to power. The power modulator 292 causes less power to be supplied when the magnet assembly 84 overlies portions of the target 90 which should be less eroded, for example, at and near the target center. The less power that is applied, the less the underlying target is sputtered. Significant modulation will not only affect the target sputtering rate, but it will also affect the ionization fraction of the sputtered atoms. The more power, the higher the ionization fraction.

Figure 25:
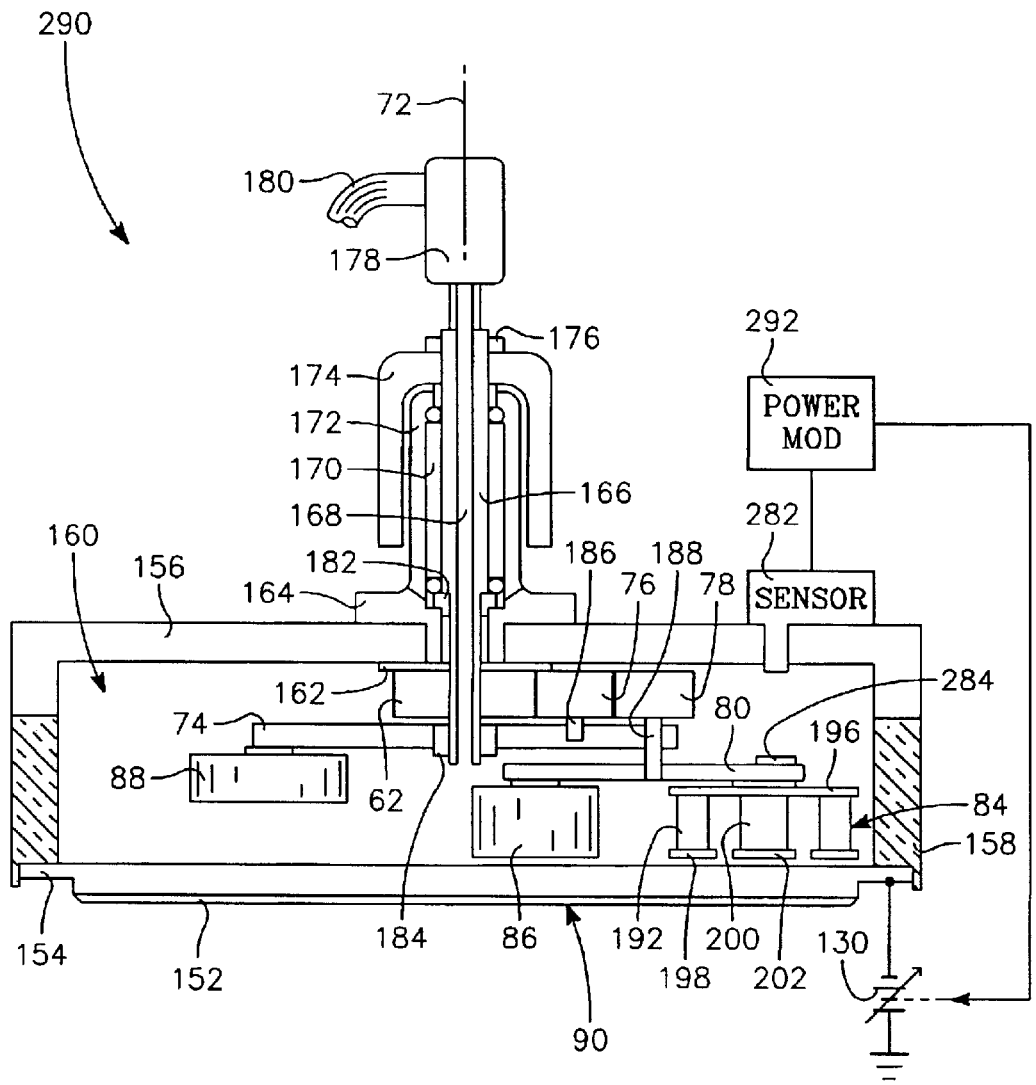
FIG. 25 is a schematic side view of a planetary magnetron assembly including modulation of target power.

Of course, the frequency modulation of FIG. 24 can be combined with the power modulation of FIG. 25. As should be apparent, the frequency and power modulators 280, 292 can be incorporated into the controller 136 of FIG. 9.

Figure 26:
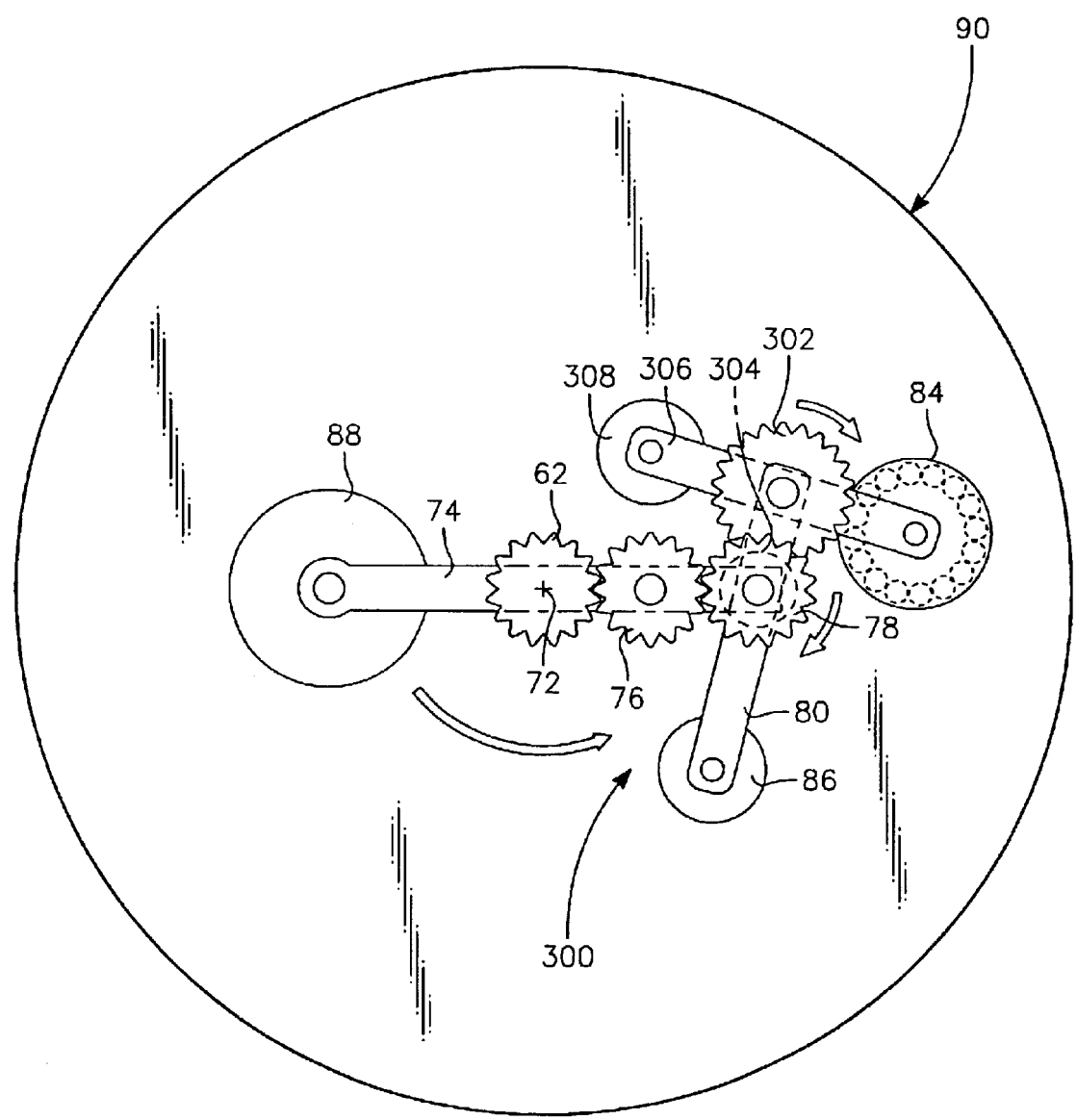
FIG. 26 is a top plan view of a two-stage planetary scanning magnetron.
Figure 27:
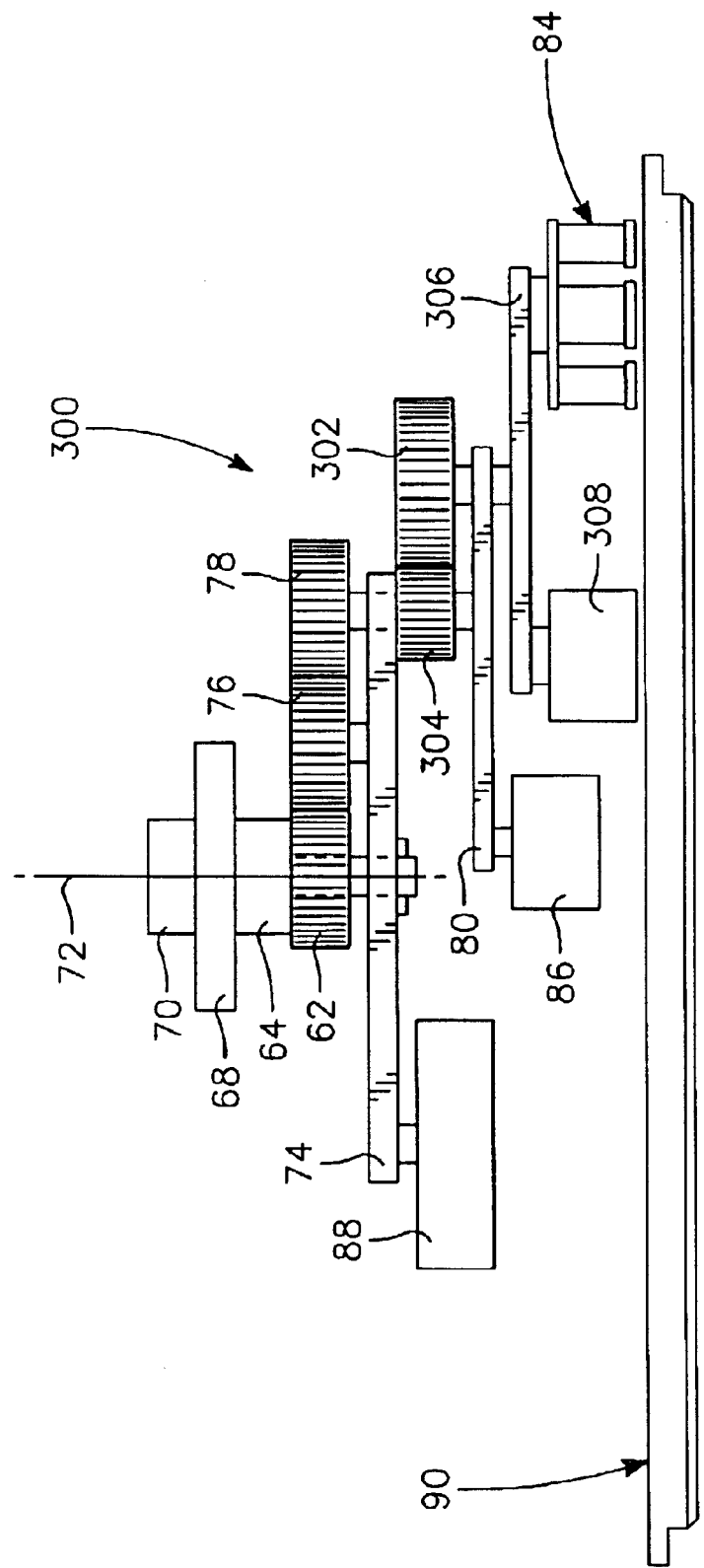
FIG. 27 is an elevational view of the scanning magnetron of FIG. 26.

Another approach to control the radial erosion pattern adds another stage of planetary motion. As illustrated in the top plan view of FIG. 26 and the elevational view of FIG. 27, a two-stage magnetron 300 includes a second-stage follower gear 302 which is rotatably mounted on the second arm 80 fixed to the rotating first-stage follower gear 78 and engages a second-stage stationary gear 304 fixed to the first arm 74. A third arm 306 is fixed to the rotating second-stage follower gear 302. The magnet assembly 84 is fixed to one end of the third arm 306, and another counterweight 308 is fixed to its other end. In this embodiment, no idler gear is interposed between the two follower gears 78, 302 so that the third arm 306 executes forward planetary motion with respect to the second arm 80 but retrograde planetary motion with respect to the first arm 74. The total effect is a two-stage planetary rotation mechanism providing a trajectory akin to that occurring at a point on the surface of a rotating moon orbiting a planet, itself orbiting the sun or alternatively a satellite orbiting the moon, which is orbiting the earth, which is orbiting the sun. The extra stage provides more control over the erosion profile.

The complex position for the two-stage motion is given by $$x = A_1 e^{i\omega_1 t} + A_2 e^{i\omega_2 t} + A_3 e^{i\phi} e^{i\omega_3 t}.$$

The phase factor $\phi$ denotes the phase difference between the otherwise complex quantities $A_1$ and $A_3$ and may be required if one of the gear ratios is unity or a small integer. A similar phase difference is not required for only two planetary arms since the coordinate axes are arbitrarily chosen and, except in degenerate or near degenerate situations, at some point in time, the two arms line up.

Following our previous derivations, the rotation rates are related by $$\omega_2 = (1+G_1)\omega_1$$

and $$\omega_3 = (1+G_2)\omega_2 = (1+G_1)(1+G_2)\omega_1,$$

where the gear ratios $G_1$ and $G_2$ relate the gears for the single stage. The time-dependent position is then represented as $$x = e^{i\omega_1 t}\{A_1 + A_2 e^{+iG_1\omega_1 t} + A_3 e^{+i(G_1+G_2+G_1 G_2)\omega_1 t}\}$$

and the square of the radial position is represented by $$r^2 = A_1^2 + A_2^2 + A_3^2 + 2A_1 A_2 \cos G_1\omega_1 t + 2A_1 A_3 \cos((G_1+G_2+G_1 G_2)\omega_1 t + \phi) + 2A_2 A_3 \cos(G_2(1+G_1)\omega_1 t + \phi).$$

Such a large number of variable factors provides great flexibility in optimizing the trajectories to smooth the erosion pattern.

Figure 28:
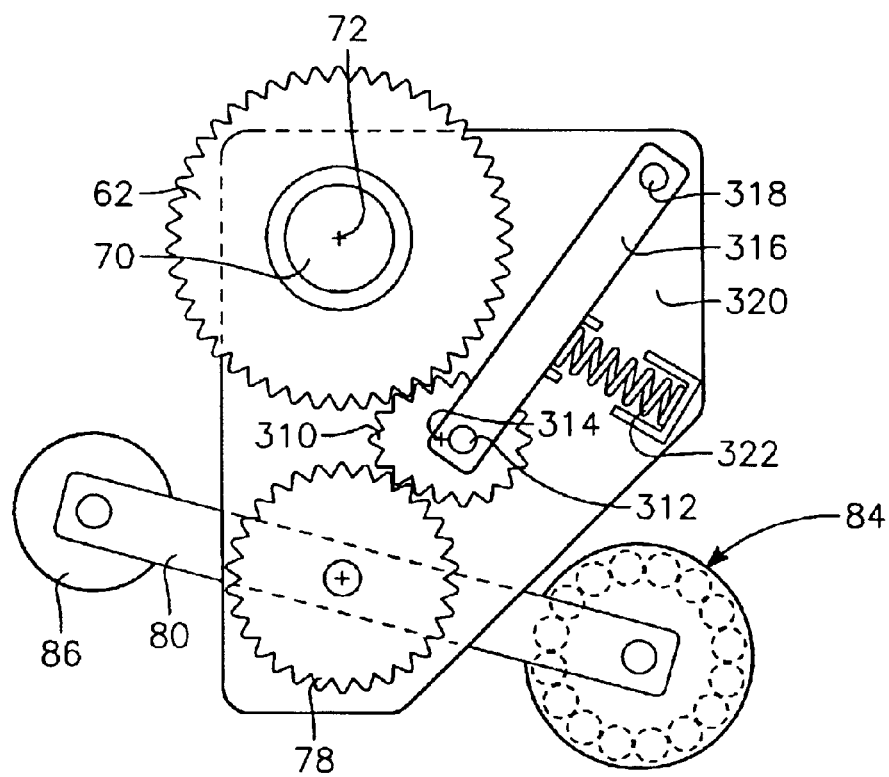
FIG. 28 is a schematic top plan view of part of a scanning magnetron assembly including an eccentric gear.

A single-stage planetary magnetron having an eccentric gear achieves a somewhat similar effect to that described above for a two-stage magnetron. For example, as illustrated in the plan view of FIG. 28, an elliptically shaped idler gear 310 is interposed between the fixed gear 62 and the follower gear 78. The elliptical gear 310 is eccentrically rotatable about a shaft 312 offset from a center 304 of the gear 310. The teeth of the elliptical gear 310 are evenly spaced along its circumference. An arm 316 swings about a pivot 318 in an irregularly shaped drive plate 320. The drive shaft 70 rotates the drive plate 320 about the shaft axis 72. A spring 322, which may operate in either tension or compression, or other forcing means fixed on one end to the drive plate 320 urges the arm 316 in a direction such that the elliptical gear 310 remains engaged with the two gears 62, 78 at all points of rotation of the elliptical gear 310. Depending upon the position of the elliptical gear 310, the instantaneous gear ratio changes such that the rotation rate of the second arm 80 varies even with a constant rotation rate of the main drive shaft 70. The described arrangement provides two types of eccentricity, the non-circularity of the gear and the offset of the gear shaft from the gear center. Either one of these alone would provide the desired effect. Other non-circular shapes, preferably oval shapes, are possible. One of the other gears 62, 78 could be eccentric or non-circular rather than the idler gear 310.

The out-of-line arrangement of three gears can save space even for the more conventional circular gears. As illustrated in the plan view of FIG. 29, a center 326 of the circular idler gear 76 is offset from the line connecting centers 72, 328 of the fixed and follower gears 62, 78 so that the latter two gears may be placed close together though out of direct engagement. A similar out-of-line arrangement can be advantageously applied to the second stage of the two-stage planetary mechanism of FIG. 25 if retrograde motion is desired there, but little space is available on the relatively short second arm 80 for an intermediate idler gear.

Figure 29:
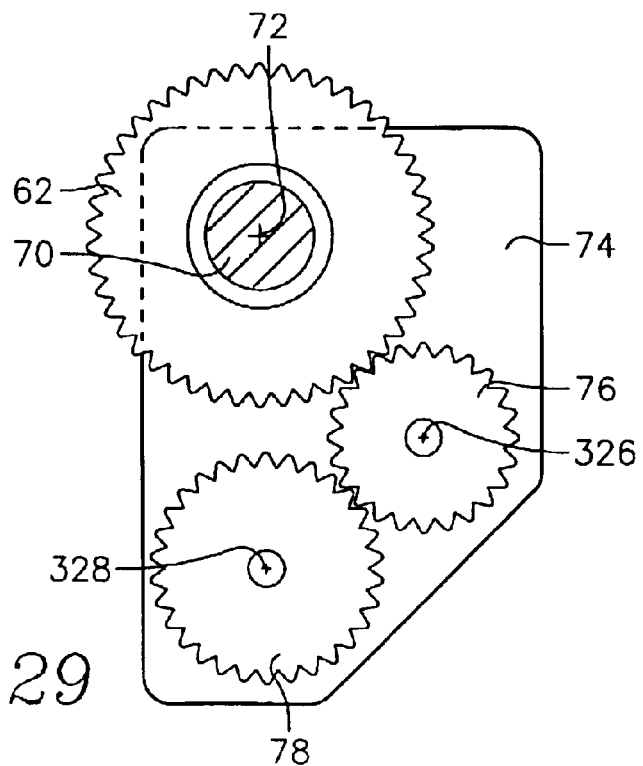
FIG. 29 is a schematic top plan view of part of a scanning magnetron assembly having an offset idler gear.

FIG. 29 may also be used to explain that the idler gear 76, whether arranged in line or out of line, may include two gear portions fixed to a common shaft arranged along the center axis 306 but having different diameters. One gear portion engages the stationary gear 62, and the other engages the follower gear 78. The gear ratio of the two coaxial gear portions on the idler gear needs to be included in the overall gear ratio G.

Figure 30:
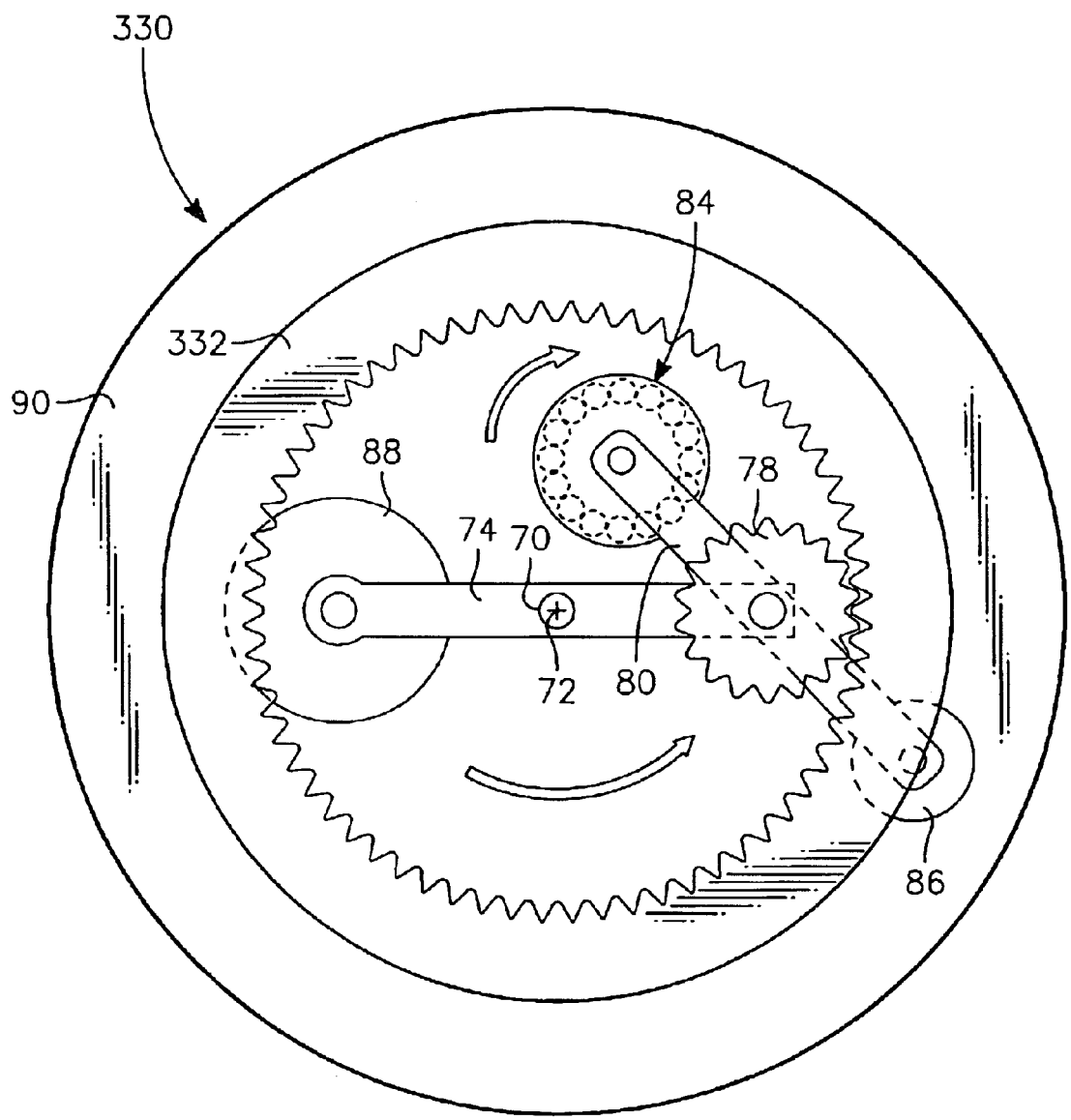
FIG. 30 is a top plan view of another type of geared planetary mechanism.

All the previously described planetary mechanisms incorporated a central fixed idler gear and gears coupling it to the magnetron arm. Other types of geared planetary mechanisms are possible. One alternative uses an external fixed gear. In a one-stage geared planetary mechanism 330 illustrated in the top plan view in FIG. 30, the drive plate 74 is held on and rotated by the motor drive shaft 70. It rotatably supports the follower gear 78 on its end with no other gears between it and the central axis 72. Instead the follower gear 78 engages an external fixed gear 332 having gear teeth on its interior. The magnet assembly 84, its bottom plate 80 and counterbalance 86 and the primary counterbalance 88 can pass beneath the fixed external gear 312, and the magnet assembly 84 can pass through the center axis 72. The support mechanism for the fixed external gear 332 is not shown but would extend over the periphery of the target 90. The illustrated planetary mechanism provides the desired retrograde planetary motion with a very simple mechanism. This mechanism differs from the Tomer planetary mechanism in that the present magnet assembly 84 is very small and the design allows its magnet portions to pass through the central axis 72 rather than Tomer's large magnetron oscillating about the center. The illustrated planetary mechanism does not include an idler gear. However, one or more of them may be included. They assist in bringing the gear ratio to smaller values.

Figure 31:
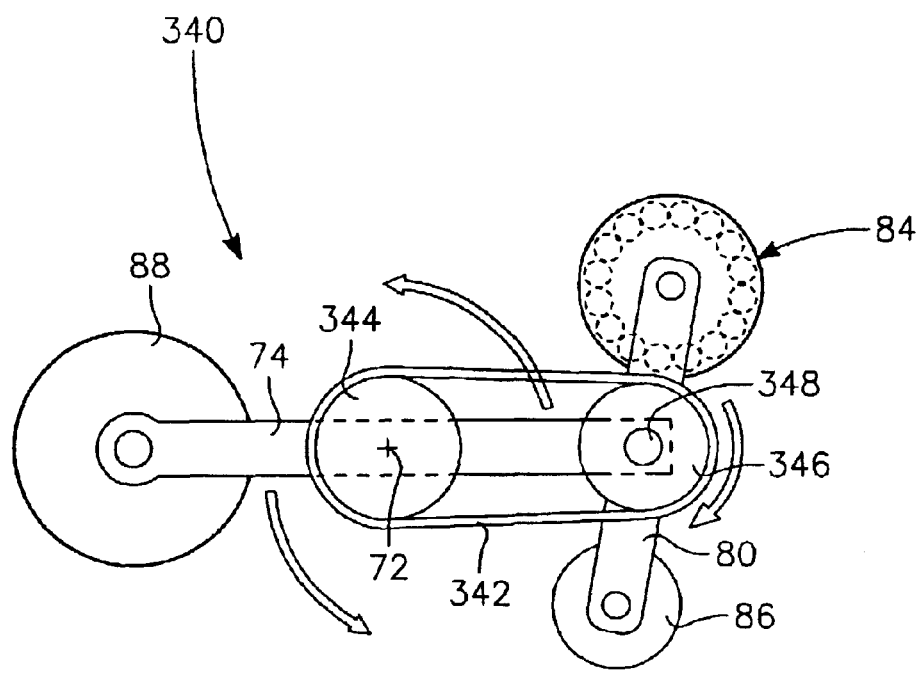
FIG. 31 is a schematic top plan view of a belted planetary magnetron assembly.

It is also possible to achieve the desired planetary motion with a belt and pulley mechanism 340, illustrated in top plan view in FIG. 31, in which different wheels are engaged by the belt rather than through gear teeth. A belt 342 is wrapped around a stationary or fixed capstan 344. The drive plate rotatably supports a follower pulley 346 is rotatably supported on the drive plate 72 through a rotatable shaft 348. The bottom plate 80 is fixed to the shaft 348 of the follower pulley 346 so it rotates with the follower pulley 346 and the magnetron 86 attached to the end of the bottom plate 80 executes planetary motion. The ratio of the rotation rates of follower pulley 346 and the drive plate 74, akin to the gear ratio of the geared planetary mechanism, is determined by the ratio of the diameters of the stationary capstan 344 and the follower pulley 346. The planetary motion is retrograde without the use of an idler. A belt will be interpreted to include a pulley belt, ridged belt, metal belt, chain, chain belt, cable, band, or other flexible structure that wraps around two generally circular members at least one of which is rotatable and engages both of them. The geared and belted embodiments share the common functions of circular members that rotatably engage with each other either through teeth on a gear wheel or shaft or through a belt wrapped around a pulley wheel or shaft. A more general concept for rotation ratios including both the geared and belted embodiments is an engagement ratio between the innermost circular member and the follower circular member. If desired, the capstan 344 can be connected to a second coaxial drive shaft to allow dynamic control of the magnetron trajectory and full coverage period.

Figure 32:
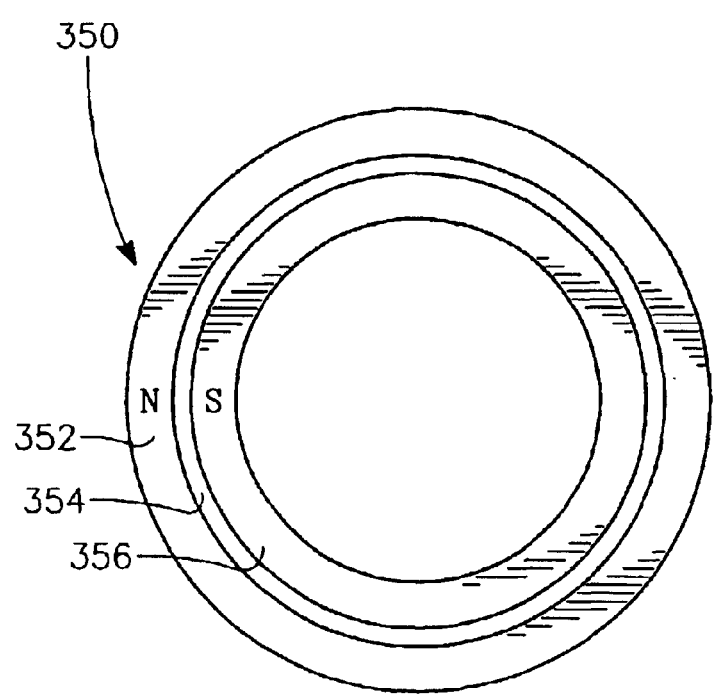
FIG. 32 is a bottom plan view a balanced narrow-gap circular magnet assembly.

The planetary mechanism is not limited to the described geared and belted embodiments as long as the mechanism achieves the desired planetary motion of the magnetron. Further, even more complicated planetary motions are possible, such as elliptical paths Although the planetary mechanism is particularly useful for unbalanced magnetrons useful in deep hole filling, it can also be advantageously be applied to balanced magnetrons more useful for blanket coverage. For example, a magnet assembly 350 illustrated in plan view in FIG. 32 includes two concentric circular band-shaped magnetic poles faces 352, 354 of opposite magnetic polarities separated by a gap 356 and producing equal total magnetic intensities. The underlying magnets may be either horseshoe magnets arranged in a circle or may be pairs of anti-parallel cylindrical magnets magnetically coupled by a magnetic yoke. Although it is possible to unbalance such a large magnetron with a hollow center, typically the magnetic strengths is balanced. This same magnetic construction is typically used in the conventional kidney-shaped magnetrons of considerably larger size. The planetary scanning provides uniform sputtering and full utilization of a target with a much smaller circular balanced magnetron. Furthermore, a relatively high density plasma is usually desired for fast sputtering rates. A small-area magnetron allows a relatively modest power supply to produce a high effective power density and hence high plasma density in the area of target adjacent the small scanned magnetron. The smaller power supply also advantageously reduces the chilling capacity required to maintain the target at a reasonable temperature.

The planetary mechanism can also drive non-circular magnetrons, such as triangular ones, whose shapes have been further optimized for uniformity and other reasons.

The planetary mechanism of any of the various designs can be used with a wide range of magnet configurations, for example, balanced vs. unbalanced, high vs. low plasma densities, and thick vs. thin sputter deposition thicknesses so that a universal planetary mechanism can be applied to a range of sputtering applications, thereby enabling an economical scanning design and reducing the parts inventory. A simple substitution of different gears or pulleys or replacement with a different magnet assembly on an otherwise universal design permits variations in coverage patterns, velocity variations, and ionization fractions and projecting magnetic components.

Although the mechanism has been explained with reference to a scanning magnetron having a planetary motion about a central axis, other mechanisms are obtainable in which the scanning is performed both radially and circumferentially of the central axis. Preferably, the design allows selection of mechanical parameters which may be selected to cause at least part of the magnet assembly to pass over the central axis. Such mechanisms include a radially acting actuator for the magnet assembly and a circumferentially rotating drive plate The planetary magnetron motion allows high-performance sputtering with a relatively simple flat target in contrast to complexly shaped and hence expensive hollow-cathode or annularly vaulted targets. However, a planetary magnetron may be advantageously used with more complex targets, especially hollow-cathode targets, to increase the uniformity of roof sputtering while decreasing the power requirements.

The invention thus promotes uniform sputtering and increased target utilization. It also permits the use of very small magnetrons, thus providing high plasma densities with relatively small power supplies without sacrifice of sputtering uniformity and target utilization. All these features can be obtained with a universal magnetron design.

What is claimed is:

1. An oscillating magnetron configured for use with a sputtering target generally symmetric about a central axis in a magnetron sputter reactor, comprising:
    a magnet assembly comprising
        an inner magnetic pole having a first magnetic polarity along said central axis and a first total magnetic intensity, and
        an outer magnetic pole surrounding said inner magnetic pole and having a second magnetic polarity opposed to said first magnetic polarity; and
    a planetary scanning mechanism moving said magnet assembly in a path radially and circumferentially of said central axis and including a stationary gear arranged about said central axis, a plurality of rotatable arms, a first arm which supports at least one rotatable gear radially outwardly of said stationary gear, and a drive shaft for driving said mechanism and passing through said stationary gear, a second arm supporting said magnet assembly being coupled to a shaft of said rotatable gear.

2. The magnetron of claim 1, wherein said at least one rotatable gear includes a follower gear rotatably mounted on said first arm and engaged with said stationary gear.

3. The magnetron of claim 2, wherein said at least one rotatable gear additionally includes at least one idler gear engaged between said stationary and follower gears.

4. The magnetron of claim 1, wherein said planetary scanning mechanism includes two planetary stages and three of said arms.

5. The magnetron of claim 1, further comprising:
    a variable speed motor driving said drive shaft; and
    a controller for said motor varying its speed according to a radial displacement of said magnet assembly from said central axis.

6. The magnetron of claim 1, further comprising:
    a variable power supply for applying electrical power to said target; and
    a controller for said power supplying varying a level of said electrical power according to a radial displacement of said magnet assembly from said central axis.

7. The magnetron of claim 1, wherein said second magnetic intensity is at least 200% of said first magnetic intensity.

8. The magnetron of claim 1, wherein an area ratio between encompassing area of said magnet assembly and an area of said target scanned by said magnet assembly is no more than 10%.

9. The magnetron of claim 8, wherein said area ratio is less than 2%.

10. The method of claim 1, wherein said planetary scanning mechanism moves said outer magnetic pole through said central axis.

11. The method of claim 1, wherein said drive shaft is fixed to said first arm.

12. A two-stage planetary magnetron configured for use with a sputtering target generally symmetric about a central axis in a magnetron sputter reactor, comprising:
    a first stationary gear arranged about said central axis;
    a drive shaft passing through said first stationary gear;
    a first arm attached to said drive shaft;
    a first follower gear rotatably supported on said first arm through a first gear shaft extending along a first axis and gearedly engaged with said first stationary gear;
    a second stationary gear fixed on said first arm and arranged around said first axis;
    a second arm attached to said first gear shaft;
    a second follower gear rotatably supported on said first arm through a second gear shaft extending along a second axis and gearedly engaged with said second stationary gear;
    a third arm attached to said second gear shaft; and
    a magnet assembly attached to said third arm.

13. The magnetron of claim 12, wherein said magnet assembly comprises:
    an inner magnetic pole having a first magnetic polarity along said central axis and a first total magnetic intensity; and
    an outer magnetic pole surrounding said inner magnetic pole and having a second magnetic polarity opposed to said first magnetic polarity and a second total magnetic intensity which is at least 200% of said first magnetic intensity.

14. The magnetron of claim 12, wherein an area ratio between an encompassing area of said magnet assembly and an area of said target scanned by said magnet assembly is no more than 10%.

15. The magnetron of claim 14, wherein said area ratio is less than 2%.

16. The magnetron of claim 12, further comprising:
    a first counterweight supported on an end of said first arm opposite an end supporting said first follower gear;
    a second counterweight supported on an end of said second arm opposite an end supporting said second follower gear; and
    a third counterweight supported on an end of said third arm opposite an end supporting said magnet assembly.

17. A magnetron sputter reactor, comprising:
    a target arranged about a central axis;
    a pedestal for supporting a substrate in opposition to said target to be sputter coated with material from said target; and
    a planetary mechanism positioned on a side of said target opposite said pedestal including
        a fixed first wheel arranged about said central axis,
        a first arm rotating about said central axis and rotatably supporting at a point outside of said first wheel a second wheel engaged with said first wheel,
        a second arm fixed to said second wheel, and
        a magnet assembly fixed to said second arm.

18. The reactor of claim 17, wherein said first and second wheels are gears engaged directly or indirectly with each other.

19. The reactor of claim 17, wherein said magnet assembly comprising an inner pole of a first magnetic polarity along said central and having a first total magnetic intensity and an outer pole of a second magnetic polarity opposite said first magnetic polarity, having a second total magnetic intensity at least twice said first total magnetic intensity, and surrounding said inner pole, whereby said second pole creates a projecting magnetic field extending towards said pedestal before returning to a back of said second pole.

20. The reactor of claim 19, further comprising at least one magnetic coil coaxial with said central axis and producing a magnetic field within its bore that is parallel to said projecting magnetic field extending towards said pedestal.

21. The reactor of claim 20, wherein said at least one magnetic coil comprises a first magnetic coil axially positioned between target and said pedestal and a second magnetic coil positioned on a side of said pedestal opposite said target.

22. The reactor claim 21, wherein a first bore of said first magnetic coil has a diameter greater than a diameter of a second bore of said second magnetic coil.

23. The reactor of claim 22, wherein said diameter of said second bore is less than a diameter of said substrate.

24. A magnetron sputter reactor, comprising:
a target arranged about a central axis;
a pedestal in opposition to said target for supporting a substrate to be sputter deposited;
a magnetron scannable about said central axis on a side of said target opposite said pedestal and comprising
an inner pole of a first magnetic polarity producing a first magnetic field along a first direction along said central axis in a space between said target and said pedestal, and
an outer pole of a second magnetic polarity opposite said first magnetic polarity, surrounding said inner pole, and producing a second magnetic field along a second direction opposite said first direction in said space;
a first electromagnetic coil arranged about said central axis at least partially radially outside of said space and having a first bore of a first diameter; and
a second electromagnetic coil arranged about said central axis on a side of said pedestal opposite said target and having a second bore of a second diameter smaller than said first diameter.

25. The reactor of claim 24, wherein said second diameter is less than a diameter of said substrate.

26. The reactor of claim 24, wherein a ratio of said first diameter to said second diameter is at least 2.0.

27. The reactor of claim 24, further comprising:
a first power supply powering said first electromagnetic coil to produce a third magnetic field along said second direction in said first bore; and
a second power supply powering said second electromagnetic coil to produce a fourth magnetic field along said second direction in said second bore.

28. The reactor of claim 24, wherein said outer pole has a total magnetic intensity greater than that of said inner pole.

29. The reactor of claim 24, further comprising a planetary mechanism for scanning a magnet assembly of said magnetron in an epicyclic path.

30. A magnetron sputter reactor, comprising:
a target arranged about a central axis;
a power supply electrically biasing said target;
a planetary mechanism executing epicyclic motion about said central axis and including a first arm connected to a drive shaft extending along said central axis and a second arm rotatably supported by said first arm;
a motor driving said drive shaft;
a magnet assembly fixed on an said second arm;
a position sensor sensing a radial position of said magnet assembly with respect to said central axis; and
a controller varying at least one of a rotation rate of said motor and a power level of said power supply in accordance with said sensed radial position.

31. The reactor of claim 30, wherein said controller varies said rotation rate of said motor in accordance with said sensed radial position.

32. The reactor of claim 30, wherein said controller varies said power level in accordance with said sensed radial position.

33. A method of sputtering, comprising the steps of:
applying electrical power to a sputtering target in a magnetron sputter reactor having a central symmetry axis;
scanning a magnetron in a path about the back of said sputtering target including moving a magnet assembly including an outer pole of a first magnetic polarity along said central symmetry axis surrounding an inner pole a second magnetic polarity opposite said first magnetic polarity along a path of variable separation from said central symmetry axis; and
varying as a function of said separation at least one of a level of said applied electrical power and a speed of said moving while said magnetron is scanned along said path.

34. The method of claim 33, wherein said varying step varies said applied electrical power.

35. The method of claim 33, wherein said varying step controllably and selectively varies said speed.

36. The method of claim 33, further comprising sensing said separation while said magnetron is being moved.

* * * * *